(12) United States Patent
Kuenemund

(10) Patent No.: US 7,999,559 B2
(45) Date of Patent: Aug. 16, 2011

(54) DIGITAL FAULT DETECTION CIRCUIT AND METHOD

(75) Inventor: Thomas Kuenemund, Munich (DE)

(73) Assignee: Infineon Technologies AG, Neubiberg (DE)

( * ) Notice: Subject to any disclaimer, the term of this patent is extended or adjusted under 35 U.S.C. 154(b) by 407 days.

(21) Appl. No.: 12/344,771

(22) Filed: Dec. 29, 2008

(65) Prior Publication Data

US 2010/0164507 A1    Jul. 1, 2010

(51) Int. Cl.
*G01R 31/02* (2006.01)
(52) U.S. Cl. ........................... 324/537; 324/500
(58) Field of Classification Search .............. 324/537, 324/500, 76.11, 73.1
See application file for complete search history.

(56) References Cited

U.S. PATENT DOCUMENTS 3,992,636 A * 11/1976 Kiffmeyer .................. 327/78
2007/0182575 A1   8/2007 Kunemund

FOREIGN PATENT DOCUMENTS

DE   10 2005 058 238 A1    6/2007

* cited by examiner

*Primary Examiner* — Vincent Q Nguyen
(74) *Attorney, Agent, or Firm* — Dickstein Shapiro LLP

(57) ABSTRACT

Digital fault detection circuit with an input circuit having input and output, wherein a first signal state at the input causes a predetermined signal state at the output and a second signal state at the input leaves the output floating; a signal line with signal line input and output, wherein the signal line input is coupled to the output of the input circuit; a keeper circuit coupled to the signal line output and configured to keep the signal line at the predetermined signal state, after the signal state at the input has changed from the first signal state to the second signal state; and a fault detector cell, which is coupled to the signal line between the signal line input and the signal line output and which is configured to change the state of the signal line which is otherwise kept by the keeper circuit, in response to a fault.

24 Claims, 11 Drawing Sheets

DIGITAL FAULT DETECTION CIRCUIT AND METHOD

TECHNICAL FIELD

In order to obtain information regarding the functionality of an integrated circuit (IC) or in order to change stored data or a signal on an integrated circuit, integrated circuits may be the target of a manipulation attempt or external attack. Such an attack on an integrated circuit may be performed by means of ionizing radiation or the use of fluctuations of a supply voltage of the integrated circuit. A manipulation or attack may also be performed by probing a signal or forcing a signal on the integrated circuit. Such a manipulation or attack may, for example, be severe for security-relevant integrated circuits, e.g. for smart cards, etc. In general, all types of integrated circuits may be the target of an attack or manipulation attempt. An integrated circuit may be protected against undesired manipulation, analysis attempts or general faults by different means.

SUMMARY

Some embodiments relate to a digital fault detection circuit and a method of detecting a fault on an integrated circuit with such a digital fault detection circuit.

DETAILED DESCRIPTION

Figure 1:
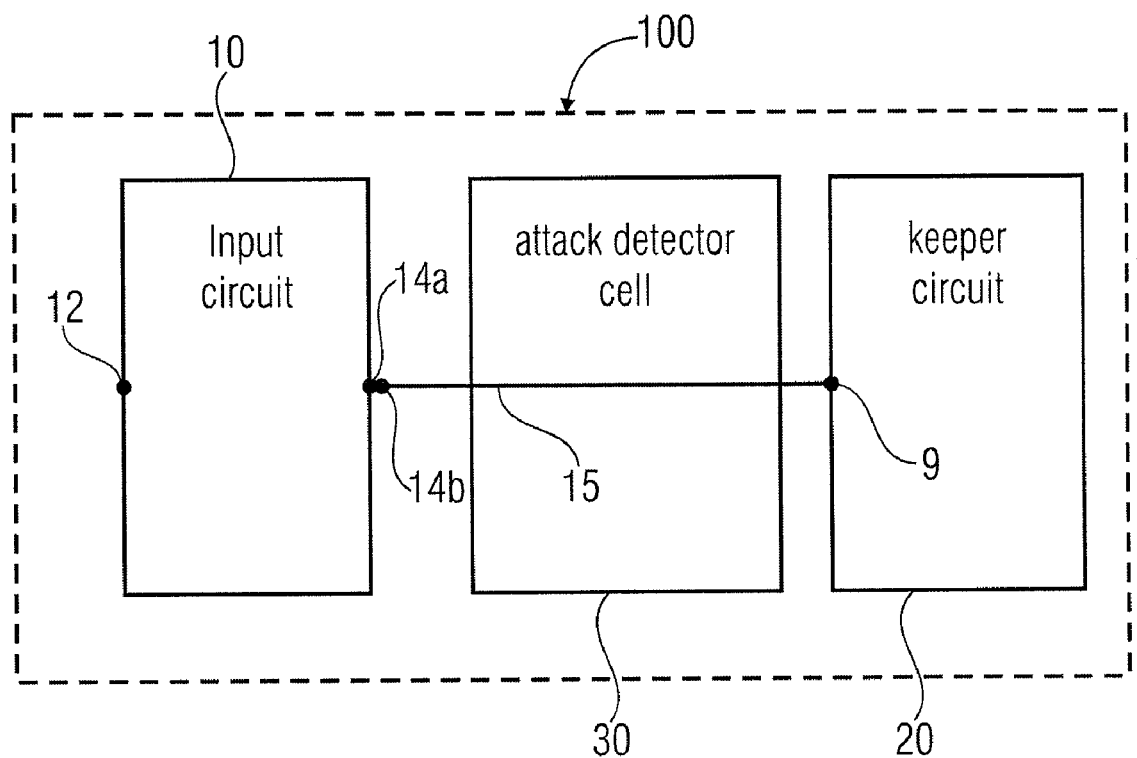
FIG. 1 shows a schematic representation of a digital fault detection circuit according to some embodiments.

FIG. 1 illustrates a schematic block diagram of a digital fault detection circuit 100. The digital fault detection circuit 100 comprises an input circuit 10 having an input 12 and at least one output 14a. A first signal state, which may be applied to the input 12, may cause a predetermined signal state at the output 14a. A second signal state, which may be applied to the input leaves the output 14a floating. The digital fault detection circuit 100 may, furthermore, comprise a signal line 15 which comprises a signal line input 14b and a signal line output 9. The signal line input 14b is coupled to the output 14a of the input circuit 10. Moreover, the digital fault detection circuit may comprise a keeper circuit 20, which is coupled to the signal line 15 and which is configured to keep the signal line 15 on the predetermined signal state, after the signal state at the input 12 has changed from the first to the second signal state. At least a fault detector cell 30 of the digital fault detection circuit 100 is coupled to the signal line 15 between the signal line input 14b and the signal line output 9. The fault detector cell 30 may be configured to change the state of the signal line 15, which is kept by the keeper circuit 20, in response to a fault. Such a fault may be upon an (external) attack.

In embodiments, the digital fault detection circuit 100 may comprise a plurality of fault detector cells 30, which are coupled to the signal line 15. Even with a plurality of fault detector cells a single input circuit 10 and a single keeper circuit 20 may be sufficient to ensure the correct functionality of the digital fault detection circuit 100. At the front-end a single input circuit 10 may be sufficient to set the output 14a and therewith the signal line 15 coupled to the plurality of fault detector cells to a predetermined signal state and at the back-end a single keeper circuit 20 may be sufficient to keep the signal line at the predetermined signal. Thus, the digital fault detection circuit may comprise a low number of circuit elements or circuit devices and, therefore, area requirements on a chip may be reduced. Since the predetermined signal state at the signal line is set by the input circuit and kept by the keeper circuit the fault detector cells may be realized with a low number of, e.g. transistors, compared to fault detector cells with integrated input circuit and hold circuit. This means the digital fault detection circuit 100 may be efficient with respect to area requirement and the number of circuit elements, e.g. transistors, which are necessary to realize the digital fault detection circuit. Such a digital fault detection circuit may comprise a high error or fault detection level.

A digital fault detection circuit 100 may be realized with few switching elements and, hence, with little area consumption, and with few switching elements, for example, transistors per protected semiconductor area. As a result, a digital fault detection circuit may be realized with low costs and, at the same time, with a high error or attack detection rate. Such a digital attack detection circuit may, therefore, also be called "efficient digital fault attack detector" (eDFAD).

In some embodiments, digital circuits are used as detectors for detecting a fault in an integrated circuit. Such a fault can be, for example, caused by an error of the integrated circuit, a manipulation or an attack on the integrated circuit. These digital circuits or fault detector cells can, on the one hand, be sensitive, for example, to the effect of ionizing radiation or fluctuations of a supply voltage of the integrated circuit, e.g. VDD-VSS. Herein, VDD may be a higher supply voltage and VSS a lower supply voltage of the integrated circuit. On the other hand, the fault detector circuit may be similar to the most sensitive possible attack targets. This means that the digital fault detection circuit may be formed as similar as possible to that of a regular digital circuit, which may be the target of an attack and which may be highly sensitive to such attacks. Such "digital detectors", which may be sub-circuits of an integrated circuit, may comprise a higher sensitivity to an attack than the most sensitive targets of an attack. Such a target may, for example, be a 6-Transistor-Static-Random-Access-Memory (SRAM) cell or other circuitry, for example, with storage functionality. Such circuitry may, for example, be realized in a static complementary-metal-oxide-semiconductor (CMOS) circuitry technology.

In some embodiments of a digital fault detection circuit for detecting an attack with ionizing radiation, the same physical effect for detecting such an attack can be exploited as for the attack itself. For example, the charge carrier separation or a short circuit across pn-junctions, which are reversed biased, can be exploited to detect an attack, if those are exposed to ionizing, that means electron-hole pairs generating radiation, e.g. photons or alpha ($\alpha$)-particles.

The same is true for attacks by means of deliberate supply voltage fluctuations with the aim, for example, either to erase a stored bit in a data storage circuit e.g. a SRAM cell or a register, or to set a bit. This may be possible for strong fluctuations in the order of the supply voltages VDD-VSS. It can be another aim to change critical timings between two registers or register blocks, for example of a data storage circuit, so that the set-up or hold times for a receiving register are violated and, hence, incorrect (calculation-) results are clocked into these registers. This can already be achieved with moderate fluctuations of VDD-VSS in the range of a few hundred millivolts. According to embodiments a digital fault detection circuit can exploit the same physical effect to detect an attack, as it is used by the attack itself. According to some embodiments, this may be achieved if the digital fault detection circuit is as similar as possible to the attack targets.

Figure 2:
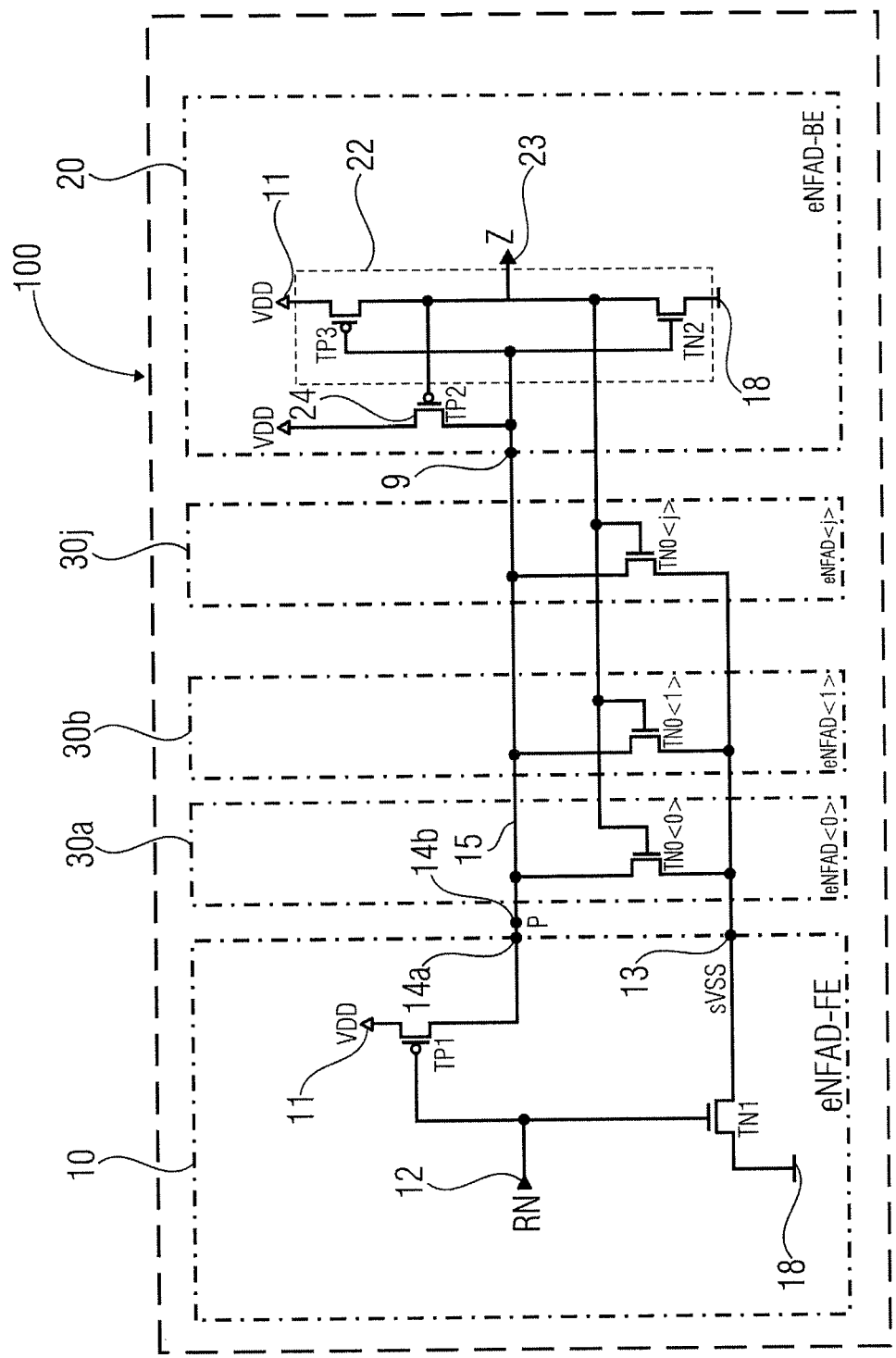
FIG. 2 shows a schematic of an efficient n-channel digital fault detection circuit according to another embodiment.

In FIG. 2, a schematic of such a digital fault detection circuit 100 is depicted. In this embodiment, the digital fault detection circuit 100 may be also named efficient n-channel fault attack detector (eNFAD). The digital fault detection circuit 100 comprises an input circuit 10 having an input 12 and at least one output 14a. Moreover the digital fault detection circuit comprises a signal line 15, wherein the signal line input 14b is coupled to the output 14a of the input circuit 10. As it is shown in FIG. 2 the digital fault detection circuit comprises a keeper circuit 20 with an output 23 and a plurality of attack detector cells 30a, 30b, . . . 30j. The input circuit 10 may also be named efficient n-channel Fault Attack Detector-Front End (eNFAD-FE), the keeper circuit 20 may be named efficient n-channel Fault Attack Detector-Backend (eNFAD-BE) and the fault detector cells 30a to 30j may be named efficient n-channel Fault Attack Detector (eNFAD<0> to eNFAD<j>).

In FIG. 2, the input 12 of the input circuit 10 may be coupled to the control gates of a p-channel transistor TP1 and an n-channel transistor TN1. Transistors may be considered in the following as switches, which can be turned on and off. According to this embodiment, the input circuit 10 may further comprise a supply potential output 13. The controllable conductive path or the channel of the transistor TN1 may be coupled between a first supply potential terminal 18 for applying a first supply potential, for example, VSS and the supply potential output 13. The controllable conductive path or the channel of the transistor TP1 may be coupled between a second supply potential terminal 11 for a second supply potential VDD and the output 14a of the input circuit 10.

If a first signal state—in this embodiment, for example, a 0 or VSS—is applied to the input 12, the switch TP1 is turned on or set to a conductive state, so that, at the output 14a a predetermined signal state is set. In this embodiment, the predetermined signal state at the output 14a may be VDD or 1. If a 0 or VSS is applied to the gate of the n-channel transistor TN1, the transistor is turned off or set in a non-conductive state. As a consequence, the supply potential output 13 is floating. According to this embodiment, a first signal state which is applied to the input 12 causes a predetermined signal state at the output 14a which is, in this embodiment 1 or VDD. Since the output 14a is connected to the signal line input 14b, the signal line 15 is also set at the predetermined signal state. By applying the second signal state, in this embodiment, a 1, to the input 12, the p-channel transistor TP1 is turned off and, hence, the output 14a is floating. In contrast, the n-channel transistor TN1 is then in a conductive state and, hence, the first supply potential is coupled to the supply potential output 13. The transistor TN1 may be necessary to interrupt the connection between the detector cell switches TN0<0>, . . . TN0<j> of the fault detection cells 30a to 30j and the first supply potential terminal 18 so that, if a first signal state is applied at the input 12, the signal line 15 can be easily set to the predetermined signal state. The detector cell switches TN0<0>, . . . TN0<j> are coupled to the floating supply potential output 13, which is at the switchable first supply potential sVSS. The switchable first supply potential sVSS may correspond to the first supply potential, but can be switched on or off in dependence on the state of the transistor TN1.

In some embodiments the input circuit 10 comprises a first switch, for example the transistor TP1, which connects the signal line input 14b to a second supply potential VDD if the first signal state is applied to the input 12 of the input circuit 10. The first switch separates the signal line input 14b from the second supply potential if the second signal state is applied to the input 12. If the first signal state is applied to the input of the input circuit a second switch, for example the transistor TN1, separates the supply potential output 13, which is at the switchable first supply potential sVSS, and hence, the fault detector cell, which is coupled to the supply potential output 13, from the first supply potential VSS. If the second signal state is applied to the input of the input circuit the fault detector cells are coupled via the conducting switch TN1 to the first supply potential.

In FIG. 2 the signal line input 14b is coupled to the output 14a of the input circuit 10 and, therefore, the signal line 15 is set to the predetermined signal state if the first signal state is applied to the input 12 of the input circuit 10. The signal line 15 is coupled to each of the fault detector cells 30a to 30j and to the keeper circuit 20. A fault detector cell may comprise a detector cell switch, for example TN0<0>, coupled between the signal line 15 and the switchable first supply potential sVSS. The detector cell switch may be a transistor. The fault detector cell 30a comprises, for example, transistor TN0<0> as detector cell switch. The detector cell switch may be configured to separate the switchable first supply potential sVSS from the signal line in the absence of a fault and to connect the switchable first supply potential in response to a fault.

The keeper circuit 20 may comprise a keeper circuit switch, for example the p-channel transistor TP2, coupled between the signal line output 9 and the second supply potential VDD. The keeper circuit switch TP2 may be configured to connect, in the absence of a fault, the signal line output 9 to the second supply potential in order to keep the signal line 15 at the predetermined signal state. In response to a fault the keeper circuit switch TP2 may be configured to separate the signal line from the second supply potential VDD. A controllable conductive path or channel of the keeper circuit switch, the transistor TP2, is coupled between VDD, i.e., the second supply potential and the signal line 15. The gate or control terminal of the p-channel transistor TP2 is coupled to an inverter 22 formed by the transistors TP3 and TN2. As a consequence, if the signal line 15 is set to its predetermined signal state—here 1—, at the control terminal of the p-channel transistor TP2 a 0 is applied and hence TP2 is turned on. Therefore the signal line 15 is kept at the predetermined signal state in the absence of a fault. The keeper circuit 20, which is coupled to the signal line 15 via the signal line output 9, may be configured to keep the signal line 15 on the predetermined signal state if the second signal state is applied to the input and the output 14a floats.

The inverter 22 comprises two transistors TP3, TN2 of a different type of conductivity. The controllable conductive path of the p-channel transistor TP3 and the controllable conductive path of the n-channel transistor TN2 of the inverter 22 may be coupled in series between a first supply potential terminal 18 for a first supply potential VSS and a second supply potential terminal 11 for a second supply potential VDD. The control terminals of TP3 and TN2 are coupled to the signal line 15. The keeper circuit 20 may furthermore comprise an output 23 for an alarm signal or output signal Z, which is configured to indicate a detection of a fault, for example, upon a manipulation, an attack or an error. The output 23 may be coupled between the channels of TP3 and TN2.

According to some embodiments the keeper circuit switch TP2 may be coupled to the signal output of the inverter 22.

In this embodiment, each of the fault detector cells 30a to 30j comprise one detector cell switch, the transistors TN0<0> to TN0<j>. Each detector cell switch is coupled between the signal line 15 and the switchable first supply potential sVSS, wherein the detector cell switch is configured to separate the switchable first supply potential from the signal line 15 in the absence of a fault and to connect the first supply potential to the signal line in response to a fault. The gates of the transistors TN0<0> to TN0<j> are coupled to the output of the inverter 22 of the keeper circuit 20, so that an opposite signal of the signal state on the signal line 15 is applied to the gates. In other words the control inputs of the detector cell switches, for example the gates of the transistors are coupled to the output of the inverter.

Upon a fault, at least one of the detector cell switches TN0<0> to TN0<j> may be turned on or switched in a conductive state and hence the signal state P at the signal line 15 is changed, so that the signal line 15 is set to VSS. As a consequence, the keeper circuit switch TP2 which is coupled to the inverter 22, is turned off and the signal line 15 is not anymore kept at its predetermined state, in this embodiment the signal state 1. The signal state Z at the output 23 is also switched from 0 to 1, indicating a fault, for example upon a successful attack. According to an embodiment, a fault detector cell is configured to change the predetermined signal state at the signal line 15 upon a fault attack. Such a fault attack may employ the use of ionizing radiation, a probing of a signal with a probe, a forcing of a signal state or generating supply voltage fluctuations.

A transistor or switch in a fault detector cell can be configured so that it delivers, in a conductive state, that means if it is turned on, at least 10 times more current—for example 20 times or 50 times more—than a transistor or switch in the keeper circuit. For this, a transistor in the fault detector cell may comprise a different channel width and/or a different channel length than a transistor in the keeper circuit. A transistor in the fault detection cell can comprise a channel width and/or a channel length, which is configured to deliver at least 10 times more current compared to a transistor in the keeper circuit 20 in a conductive state of the transistor. The transistors in the keeper circuit may be configured to deliver an amount of current, which is sufficient to compensate leakage currents of the integrated circuit which, for example, may be induced by several thermal processes. A detector cell switch can comprise a current conducting capacity which is larger than a current conducting switch of the keeper circuit switch. In addition n-channel transistors may be used as fault detector switches, since an n-channel transistor may comprise an immanent higher current conducting capacity than a comparable p-channel transistor.

As it is shown, for example, in FIG. 2, the digital fault detection circuit 100 can include a keeper circuit 20, which comprises an inverter 22 configured to couple the opposite signal state at the signal line 15 to a control terminal or control input of a keeper circuit switch TP2. Thereby, the signal line 15 is coupled to the control inputs of the transistors TP3, TN2, which form the inverter 22. The keeper circuit switch TP2 is coupled between the second supply potential VDD and the signal line 15. The keeper circuit switch TP2 can be switched by the signal state at the signal line 15 between a conductive state and a non-conductive state. If the signal line 15 is in the predetermined signal state and the second supply potential is equal or corresponds to the predetermined signal state, the keeper circuit switch TP2 is turned on and the predetermined signal state on the signal line 15 is kept or held by the conductive connection at the predetermined state.

Each fault detector cell 30a to 30j may comprise one transistor, for example, the n-channel transistors TN0<0> to TN0 (j), whose gates may be coupled to the output 23 of the inverter 22 of the keeper circuit 20 and therewith to the inverse or opposite signal state P at the signal line 15. Thus, an inverse signal state at the control inputs of the transistors TN0<0> to TN0<j> is achieved by means of the transistor TP3 and TN2 of the inverter 22. Depending on the signal state at the signal line 15, one of the two transistors TP3 and TN2 is in a conductive state and the respective supply potential is then coupled to the control inputs (gates) of the transistors in the fault detector cells. According to this embodiment, a fault detector cell may comprise one transistor, wherein the controllable conductive path of the transistor or switch is coupled between the signal line 15 and the switchable first supply potential sVSS. The control terminal of the transistor is coupled to the signal line 15 via an inverter 22 so that the transistor is switchable between a non-conductive state and a conductive state by a change of the signal state at the signal line 15. If the transistor, for example, TN0<0> is in a conductive state, the signal line is coupled to the switchable first supply potential sVSS, if the output 14a of the input circuit 10 is floating. It is obvious that in other embodiments, the efficient n-channel fault attack detector circuit, the digital fault detector circuit 100 in FIG. 2 or FIG. 3 can be replaced by a complementary circuit structure by exchanging n-channel transistors and p-channel transistors. Thus, a p-channel fault attack detector circuit can be realized. A signal fault detector cell may then comprise, for example, one single p-channel transistor, whose drain is then connected with the signal line 15 and wherein the signal line 15 may, in this case, be on a predetermined signal state which is then given by a "low state", 0 or VSS. This predetermined signal state may then be stabilized by a respective adapted keeper circuit 20, which may be configured to keep or hold the signal line at the predetermined "low state".

Figure 3:
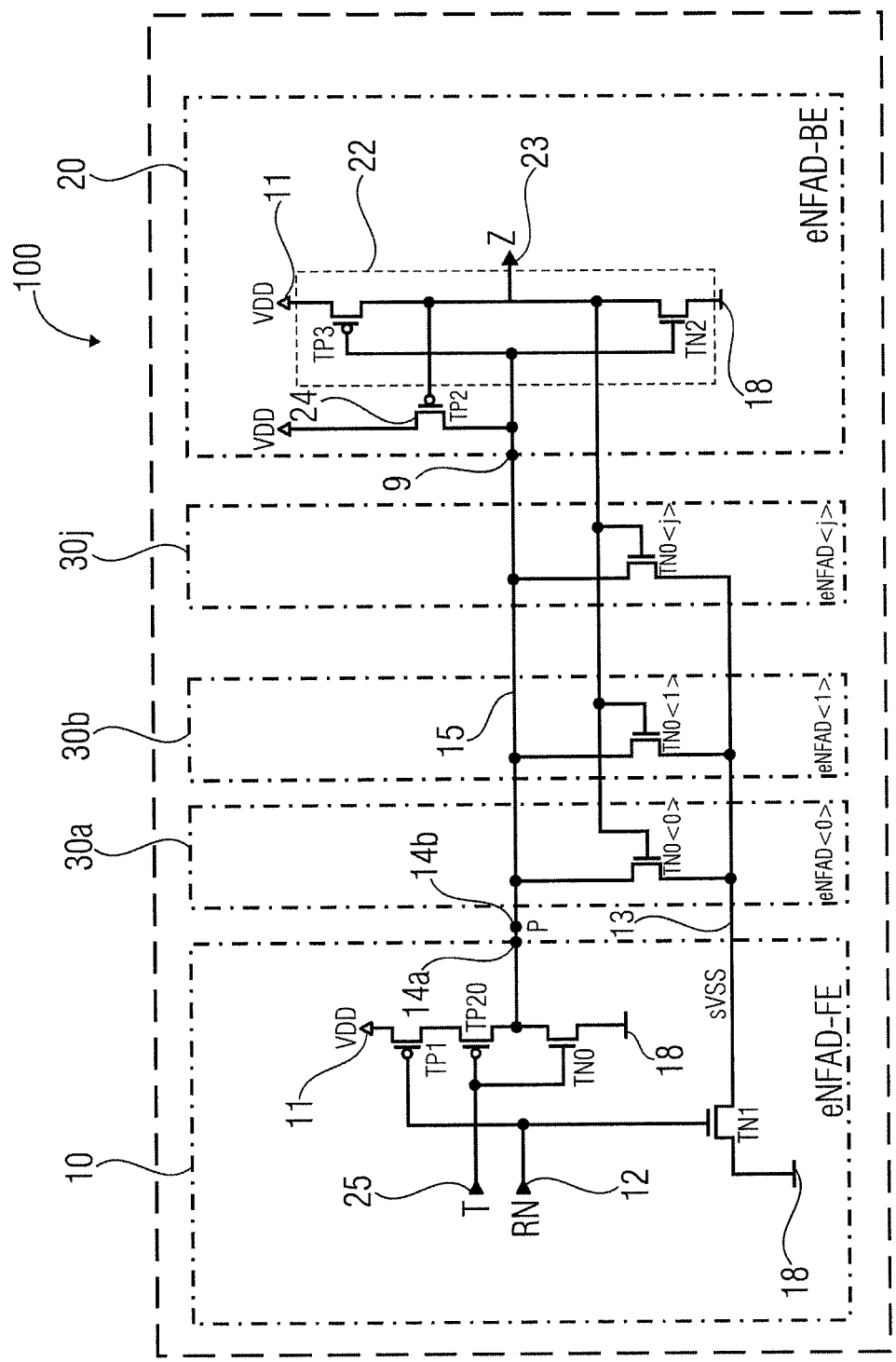
FIG. 3 shows a schematic of an n-channel digital fault detection circuit with test signal input according to another embodiment.

In FIG. 3, another embodiment of a digital fault detection circuit 100 is depicted. In this embodiment, the digital fault detection circuit comprises an additional test mode input 25. A test mode signal T applied to the test mode input 25 provoke a signal state at the output 14a of the input circuit 10, which is indicative for a fault. In the embodiment, depicted in FIG. 3, a test mode signal T may be the "high state", 1 or VDD so that the n-channel transistor TN0 in the input circuit 10 is in a conductive state and the output 14a and therewith the signal line 15 with its signal line output 14b is coupled to the first supply potential VSS. At the same time, if a 1 is applied to the test mode input 25, the p-channel transistor TP20 is turned off. Therewith a connection to the second supply potential VDD can be interrupted, independent of the signal state which is applied to the input 12. That means in this embodiment, the test mode input 25 is dominant compared to the input 12. Independent of the signal state RN at the input 12 the alarm state, here P=0, is achieved, if test signal state T=1 is applied to the test mode input 25.

According to other embodiments, the input 12 of the input circuit 10 may be realized so that an input signal RN is dominant compared to a test mode input 25.

If an inactive test mode signal, in this embodiment a "low state" or VSS is applied to the test mode input 25 the transistor TN0 is turned off, and the transistor TP20 is turned on so that depending on the signal state, which is applied to the input 12, the output 14 of the input circuit 10 can be set to the predetermined signal state. For this, a first signal state, in this case a "low state" or VSS, has to be applied to the input 12 so that the p-channel transistor TP1 is turned on and the output 14a is coupled to the second supply potential VDD. The operation and the reference numerals of the remaining elements in FIG. 3 are already described in context to the description of FIG. 2; therefore those elements are not described here again.

By applying a test mode signal to the test mode input 25, a so-called "life test" can be performed. Such a test may be performed to check the correct functionality and the correct wiring between the different sub-circuits (e.g. input circuit, keeper circuit, fault detection cells) and elements of the digital fault detection circuit. This verification of the correct functionality and correct wiring of the implemented efficient digital fault detection circuit can be performed before an integrated circuit with the digital fault detection circuit, starts with its regular operation. The verification may be done in order to ensure that no manipulation of the digital fault detection circuit has taken place, which may influence the correct functionality of the digital fault detection circuit.

If a test mode signal is applied to the test mode input 25, the output 14a of the input circuit 10 and therewith the signal line 15 is set to VSS and, as a consequence, the alarm signal state Z at the output 23 of the keeper circuit 20 is 1. This indicates in this case that the digital attack detection circuit works correctly and no manipulation of the digital attack detection circuit has taken place. By applying a test mode signal, a fault which provokes a change of the predetermined signal state on the signal line is "simulated".

A digital fault detection circuit 100 may comprise a test mode switch, for example the transistor TN0 coupled to the test mode input 25 and configured to change the state of the signal line 15 upon receipt of the test mode signal at the test mode input to simulate a fault. This can be done to check the correct functionality of the digital fault detection circuit. A test mode signal applied to the test mode input may be appropriate to change the signal line in order to simulate on purpose a fault.

Figure 4:
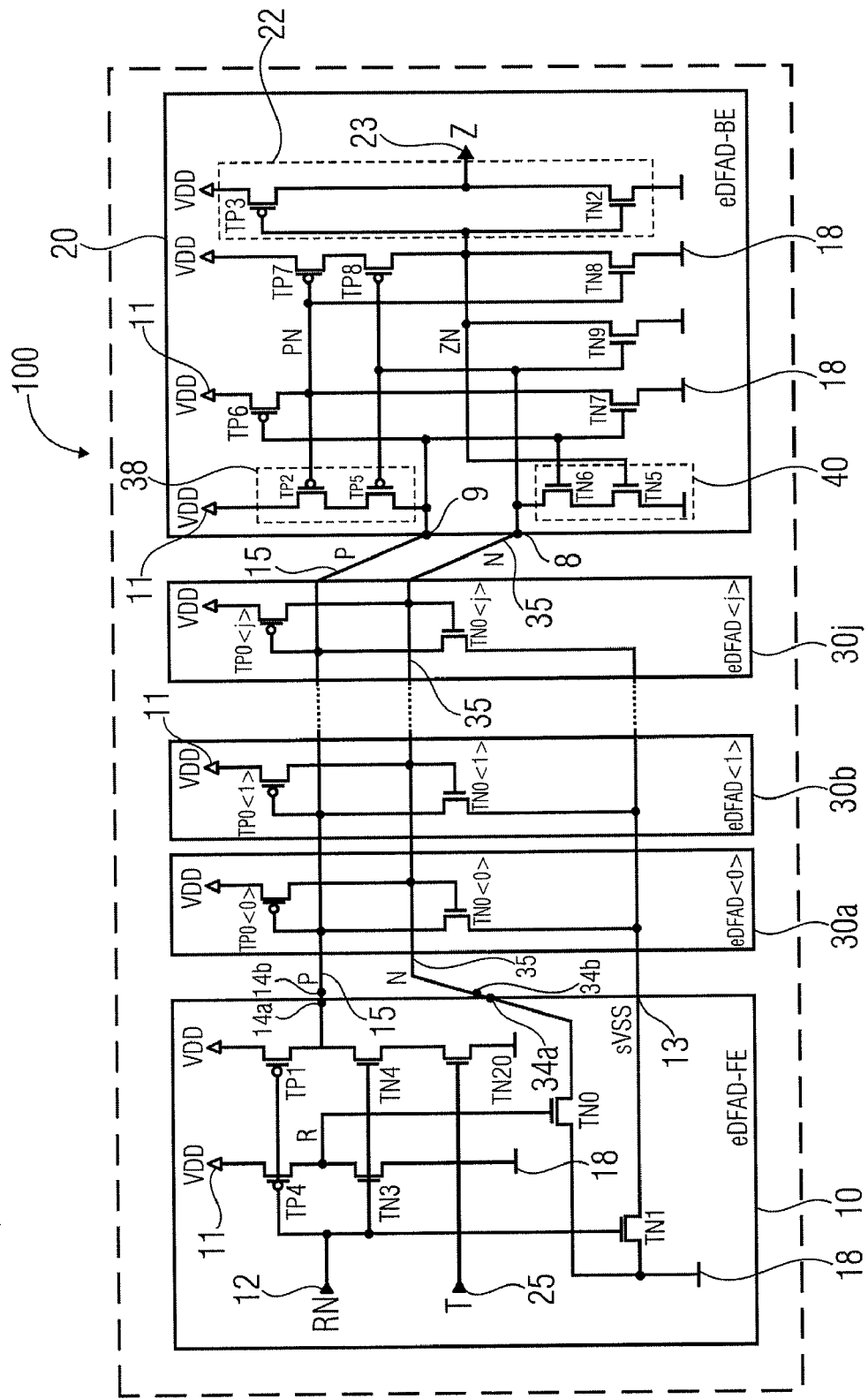
FIG. 4 shows a schematic of a digital fault detection circuit with a test signal input, a signal line and a further signal line according to another embodiment.

In FIG. 4, a further embodiment of a digital fault detection circuit 100, which comprises an input circuit 10, a keeper circuit 20 and a plurality of fault detector cells 30a to 30j, is shown.

The digital fault detection circuit 100 may comprise an input circuit 10 with an output 14a and a further output 34a. The output 14a is coupled to the signal line input 14b of the signal line 15 and the further output 34a is coupled to a further signal line input 34b of a further signal line 35. A first signal state RN=0, which is applied to the input 12 causes a predetermined signal state at output 14a and a second predetermined signal state at the further output 34a. This can be achieved by turning on the p-channel transistor or switch TP1 in the input circuit 10. As a consequence, the output 14a and therewith the signal line 15 is coupled to the second supply potential VDD. By applying the first signal state to the input 12, the switch TP4 is turned on. As a consequence VDD is coupled to the control input (gate) of the n-channel transistor TN0 and therewith the switch TN0 is turned on so that the further output 34a, is set to the second predetermined signal state VSS. Then, the signal line 15 may be at the predetermined signal state and the further signal line 35 may be at the second predetermined signal state. In this embodiment, the predetermined signal state and the second predetermined signal state are inverse or opposite of each other. They depend on the employed first and second supply potential.

If a second signal state RN=1 is applied to the input 12 the p-channel transistor TP1 and TP4 are turned off. At the same time, the n-channel transistors TN3 and TN4 are turned on and the node R is coupled to VSS and therewith the n-channel transistor TN0 is turned off. This means that the further output 34a and the output 14a are floating if T=0. If the second signal state is applied to the input 12 the switch TN1 is also turned on so that the fault detector cells 30a to 30j are coupled to the first supply potential VSS via the conductive transistor TN1.

In this embodiment, the signal line 15 and the further signal line 35 are coupled to each of the fault detector cells 30a to 30j and to the keeper circuit 20. The keeper circuit 20 is coupled to the signal line output 9 and to a further signal line output 8 of the further signal line. It is configured to keep the signal line 15 at the predetermined signal state and to keep the further signal line 35 at the second predetermined signal state, when the signal state at the input 12 changes from the first signal state to the second signal state. In other words, if the output 14a and the further output 34a is switched in a floating state by the second signal state, applied to the input 12, the keeper circuit 20 keeps the signal line 15 at VDD and the further signal line 35 at VSS. It should be noted that the predetermined signal state and the second predetermined signal state need not exactly correspond to VDD and VSS. Because of a possible voltage drop, for example, at transistors and signal lines, which are coupled between the first and the second supply potentials and the respective signal line or the further signal line the actual voltage level may be slightly different from VDD and VSS.

According to some embodiments the input circuit 10 may comprise a first switch TP1 which can couple the signal line input 14b to the second supply potential VDD if a first signal state RN=0 is applied to the input 12 of the input circuit 10 and separating the signal line input 14b from the second supply potential VDD if the second signal state is applied to the input 12 of the input circuit 10. Moreover a second switch TN0 couples the further signal line input 34b to the first supply potential VSS, if the first signal state is applied to the input 12 of the input circuit 10 and separates the further signal line input 34b from the first supply potential VSS if the second signal state is applied to the input 12 of the input circuit 10. The input circuit may comprise furthermore a third switch TN1 separating detector cell switches TN0<0>, . . . TN0<j> from the first supply potential VSS, if the first signal state is applied to the input of the input circuit and connecting all detector cell switches TN0<0>, . . . TN0<j> to the first supply potential VSS if the second signal state is applied to the input of the input circuit.

The input circuit 10 in FIG. 4 comprises a test mode input 25, which is configured to change the predetermined signal state at the output 14a and, hence, at the signal line 15, as well as the second predetermined signal state at the further output 34a and therewith at the further signal line 35. For this, a test mode signal may be applied to the test mode input 25 which may be, in this embodiment, a "high state" in order to turn on the transistor TN20 and couple the first supply potential VSS via the output 14a and to signal line input 14b. In order to do so, the transistor TN4, which is controlled by the input 12, is in a conductive state. This means a test mode signal T=1 is applied to the test mode input and a signal state RN1 at the input 12. As a consequence, both switches TN4 and TN20 are turned on and the output 14a and therewith the signal line 15 are coupled to the first supply potential VSS. This may then provoke a change of the output signal Z at the output 23. In this embodiment the signal RN at the input 12 is dominant compared to the signal T at the test mode input 25.

Moreover, FIG. 4 shows a digital fault detection circuit 100 with a keeper circuit 20 having a first pair of transistors 38 of a first type of conductivity, in this embodiment p-channel transistors TP2 and TP5, wherein the controllable conductive paths of the first pair 38 of transistors are coupled in series between the second supply potential VDD and the signal line 15. Furthermore, the keeper circuit 20 comprises a second pair 40 of transistors of a second type of conductivity, in this embodiment n-channel transistors TN5 and TN6, wherein the controllable conductive paths of the second pair 40 of transistors are coupled in series between the first supply potential VSS and the further signal line 35. The control terminal of the p-channel transistor TP5 of the first pair of transistors 38 is coupled to the further signal line 35 and the control terminal of the p-channel transistor TP2 of the first pair 38 of transistors is coupled via the p-channel transistor TP6 and the n-channel transistor TN7 to the signal line 15. The same applies to the n-channel transistor TN6 of the second pair 40 of transistors, whose control terminal is coupled to the signal line 15. The control terminal of the n-channel transistor TN5 of the second pair 40 of transistors which is coupled via the n-channel transistors TN9, TN8 and the p-channel transistor TP8 to the further signal line 35. In other words the first 38 and the 40 second pairs of transistors are controllable by the signal state at the signal line 15 and the further signal state at the further signal line 35. One transistor of each pair is controlled by the signal state at the signal line 15 and the other transistor of each of the two pairs of transistors is controlled by the signal state at the further signal line 35. In this embodiment, the predetermined signal state at the signal line and the second predetermined signal state at the further signal line is kept or held if they are at their predetermined states and, therefore, both transistor pairs 38, 40 are turned on, so that the signal line 15 is coupled to VDD and the further signal line 35 is coupled to VSS. A predetermined signal state at the signal line 15 and a second predetermined signal state at the further signal line 35 turns on the first 38 and the second 40 pair of transistors so that the signal line is kept at the predetermined signal state and the further signal line is kept at the second predetermined signal state.

If a change of the predetermined signal state at the signal line 15 or a change of the second predetermined signal state at the further signal line caused by a fault, e.g. an attack or during a test using the test mode input takes place, at least one transistor or switch of each pair 38,40 of transistors is turned off. As a consequence, the signal line and the further signal line are not held anymore at their respective predetermined signal states.

If the predetermined signal state is VDD, the node PN in the keeper circuit 20 is at 0, because of the transistor TN7, which is turned on if the signal line 15 is at the predetermined signal state VDD. As a further consequence, the node ZN is coupled to VDD, since the p-channel transistor TP7 is turned on if PN is at 0 and the second predetermined signal state is 0, so that the p-channel transistor TP8 is also in a conductive state. The node ZN is connected to the inverter 22 and, hence, the signal state Z at the output 23 is 0. This indicates in this embodiment that the signal line 15 is at the predetermined signal state and the further signal line 35 is at the second predetermined signal state.

A fault, e.g. because of an attack, a manipulation or an error, can change the predetermined signal state and/or the second predetermined signal state and the retaining of the signal states at the signal line and the second signal line by the keeper circuit is disabled. At the output 23, an alarm signal Z=1 appears. For this, the predetermined signal state at the signal line 15 may change from 1 to 0 and, as a consequence, the p-channel transistor TP6 is turned on so that the signal state at the node PN changes to 1 and, hence, the p-channel transistor TP7 is turned off. As a result the signal state at the node ZN changes from 1 to 0, since TP7 is turned off and the n-channel transistor TN8 is turned on. Therewith, the node ZN is coupled to the first supply potential terminal 18 at the first supply potential VSS. Since the signal state at the node ZN is 0, at the output of the inverter 22, a signal state Z=1 appears, indicating a fault or a test.

If the second predetermined signal state at the further signal line 35 changes from 0 to 1, because of an attack, a manipulation or an error, the p-channel transistor TP8 in the keeper circuit 20 is turned off and the n-channel transistor TN9 is turned on. Therefore, the signal state at the node ZN is 0, since it is coupled to the first supply potential VSS and the signal state Z at the output 23 is again 1 indicating a fault.

A digital fault detection circuit can, as it is shown, for example, in FIG. 4 comprise a series connection of two keeper circuit switches TP2, TP5 coupled between the signal line output and the second supply potential, a first one controlled by the signal state on the further signal line and a second one controlled by an inverted version of the signal state on the signal line.

According to some embodiments, a fault detector cell is configured to detect a fault and to change a predetermined signal state at the signal line and/or to change the second predetermined signal state at the further signal line upon such a fault. In some embodiments, each single fault detector cell 30a to 30j comprises two switches, e.g. two transistors. One transistor may be a p-channel transistor, TP0<0>, TP0<1>, . . . TP0<j> and the other transistor may be an n-channel transistor, TN0<0>, TN0<1>, . . . TN0<j>. The controllable conductive path or the channel of each of the p-channel transistors TP0<0>, . . . TP0<j>, may be coupled between the second supply potential and the control terminals of the respective n-channel transistors TN0<0>, . . . TN0<j> of the fault detection cells. The further signal line 35 may also be coupled to the control terminals of the n-channel transistors TN0<0>, . . . TN0<j>. The controllable conductive path of the n-channel transistors TN0<0>, . . . TN0<j> may furthermore coupled between the switchable first supply potential sVSS and the control terminals of the p-channel transistors TP0<0>, . . . TP0<j> and the signal line 15 may be coupled to the control terminals of the p-channel transistors TP0<0>, . . . TP0<j>.

A fault detector cell, for example, 30a may comprise two transistors of a different type of conductivity, wherein the controllable conductive path of each transistor is coupled to the control terminal of the other transistor and, hence, providing mutual feedback to each other and to a first or second supply potential. The control terminal of each of the transistors of the fault detector cell is furthermore coupled to one of the signal lines 15 or further signal line 35 so that a predetermined signal state at the signal line and the second predetermined signal state at the second signal line leaves the two transistors in a non-conductive state. In other words, if the signal line and the second signal line are at their predetermined signal states, both transistors of the fault detector cell are turned off. The transistors are coupled thus to provide mutual feedback. If, for example, due to an attack, a manipulation or an error one of the transistors of the fault detector cell is turned on, a predetermined signal state of the signal line or a second predetermined signal state at the second signal line changes. In this embodiment the signal line 15 is then set to 0 and the further signal line is set to 1. This change of the predetermined signal states is promoted by the mutual feedback of the transistors of the fault detection cell. This may lead, because of the mutual feedback of the p- and n-channel transistor to an alarm (P,N)=(0,1). Due to a successful manipulation or an attack, at least one transistor of one fault detector cell may switch from a non-conductive state to a conductive state. Thereby, the altered predetermined signal state and the altered second predetermined signal state are held by the two transistors at their respective altered signal state. As a further consequence the transistors of the other fault detector cells may be switched in a conductive state.

In FIG. 4, a schematic representation of an efficient digital fault attack detection circuit (eDFAD) or digital fault detection circuit is depicted. The schematic shown in FIG. 4 comprises an eDFAD with a dominant RN input. In this embodiment the test signal input 25 can only be active if the input 12 is set to the "high state". The input circuit 10, which is also named eDFAD-FE (FE-front end) may serve as an input stage for resetting (with a low active reset input RN=0) the whole digital fault detection circuit. Due to this, the eDFAD can be "live" after the rising edge of the signal state RN, this means RN goes to 1 if the test mode is not activated with T=1. "Live" means in this context sensitive with respect to fault attacks. The digital fault detection circuit is "live" if the signal line 15 and the further signal line 35 are at their respective predetermined signal states. The eDFAD-FE may also serve for test purposes and the adoption of a test input signal T, which may be the case for RN=1, that means if RN is inactive. An active RN, that means if at the input 12 a 0 is applied, overwrites T, i.e. RN is "dominant".

The circuit parts eDFAD<0>, eDFAD<1>, . . . , eDFAD<j>, are j+1 in parallel coupled actual detector circuits, which are set with RN=0 to the state combination (P,N)=(1,0) and which, with the rising edge of RN, i.e. RN goes to 1, remain in this state "live". The p-channel transistors TP0<k>, as well as the n-channel transistors TN0<k>, k=0,1, . . . , j are non-conductive, because of (P,N)=(1,0). This combination of states (P,N)=(1,0) is kept statically because of the feedback provided by the eDFAD-BE (efficient digital fault attack detector-back end).

The keeper circuit 20 or the eDFAD-BE (back-end) may be the output stage of the digital fault detection circuit. The eDFAD-BE may comprise in this embodiment the output 23 for the alarm signal Z=OR(PN,N) and may serve as keeper circuit for the reset state (P,N)=(1,0), which is set by the eDFAD-FE after RN is switched to an inactive state again as soon as RN=1 is valid. The keeper circuit may include in this embodiment, the transistors TP2, TP5, TN6 and TN5. Thereby, it may be assumed that the test mode is not active, that means T=0. Due to PN=NOT(P) and ZN=NOR(PN,N) it follows PN=0 and ZN=1, i.e. all four transistors TP2, TP5, TN6 and TN5 are conductive or in a conductive state and keep the combination of states (P,N)=(1,0) at the signal line. With (RN, T)=(1,1) the test mode is active. Then, first (P,N)=(0,1) is valid, which is effectuated by the circuit in eDFAD-FE and, furthermore, Z=OR(PN,N)=OR(1,1)=1 is valid. The alarm signal state Z at the alarm output 23 is, in this embodiment, set by (RN,T)=(1,1). The test serves as a so-called "life test" for a verification of the correct functionality and a verification of correct connections and a correct wiring of the circuit. Thus, by means of the test it can be checked whether the wiring of the implemented eDFAD is intact. The verification can take place before the "regular" switching-on of the integrated circuit in order to ensure that no manipulation has taken place, which could affect the correct operation of the eDFAD. After this "life test", the reset state (P,N)=(1,0) is set with RN=0 before the digital fault detection circuit or eDFAD with (RN, T)=(1,0) is "live" as described above. As long as (RN, T)=(1, 0) is valid and without a successful attack, for example, by means of a laser or "VDD-spike", eDFAD remains at the state (P,N)=(1,0).

However, in case of a successful attack, first, at least one of the detector elements, i.e. at least one of the parallel coupled p-channel transistors TP0<k> or n-channel transistors TN0<k>, k=0, 1, . . . , j, is conductive, which results, because of the mutual feedback of the transistors TP0<k> and TN0<k> in the alarm (P,N)=(0,1) and, finally, to Z=OR(PN, N)=OR(1,1)=1. This alarm (P,N)=(0,1) is also kept statically by the mutual feedback between the transistors TP0<j> and TN0<k> and can only be left again with RN=0.

Figure 5:
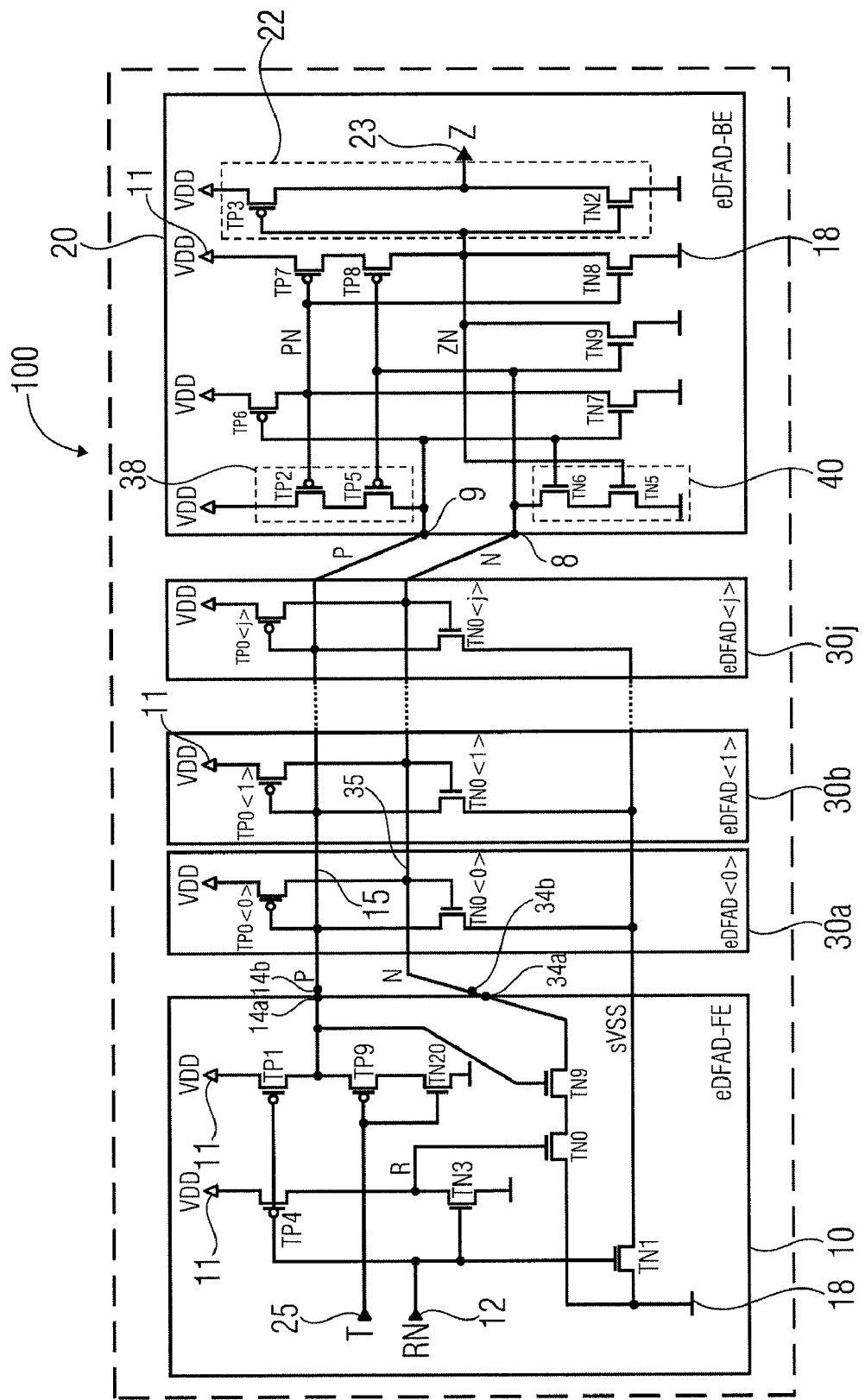
FIG. 5 shows a schematic of a digital fault detection circuit with a test signal input and two signal lines.

In FIG. 5, another embodiment of a digital fault detection circuit 100, is shown. The embodiment shows a so-called eDFAD ("dominant T") circuit, which differs from the eDFAD ("dominant RN") circuit in FIG. 4 concerning the input circuit 10. The test mode signal T, which can be applied to the test mode input 25, is dominant with respect to the input signal RN, which is applied to the input 12. The alarm (P,N)= (0,1) is set for T=1 independent of the input signal RN at the input 12. For (RN,T)=(0,0), the reset state (P,N)=(1,0) can be achieved. The reset state may correspond to the predetermined signal state at the signal line 15 and the second predetermined signal state at the further signal line 35. If the test mode signal T=1 is applied to the test mode input 25 the n-channel transistor TN20 is turned on and the p-channel transistor TP9 is turned off so that the output 14a of the input circuit 10 is coupled to the first supply potential VSS. This means that the predetermined signal state at the signal line 15 is coupled to VSS. Since, in this embodiment the control terminal of the transistor TN9 is coupled to the output 14a, it is ensured that the second output 34a is floating if the test mode signal T=1 is applied, because of the non-conducting transistor TN9. The remaining sub-circuits and elements, which are depicted in FIG. 5 are described in context to FIG. 4. In this embodiment of a "dominant T" digital fault detection circuit 100 a fault attack on the input circuit 10 may be also detected, since a test mode signal could be triggered which would indicate such a fault attack.

Figure 6:
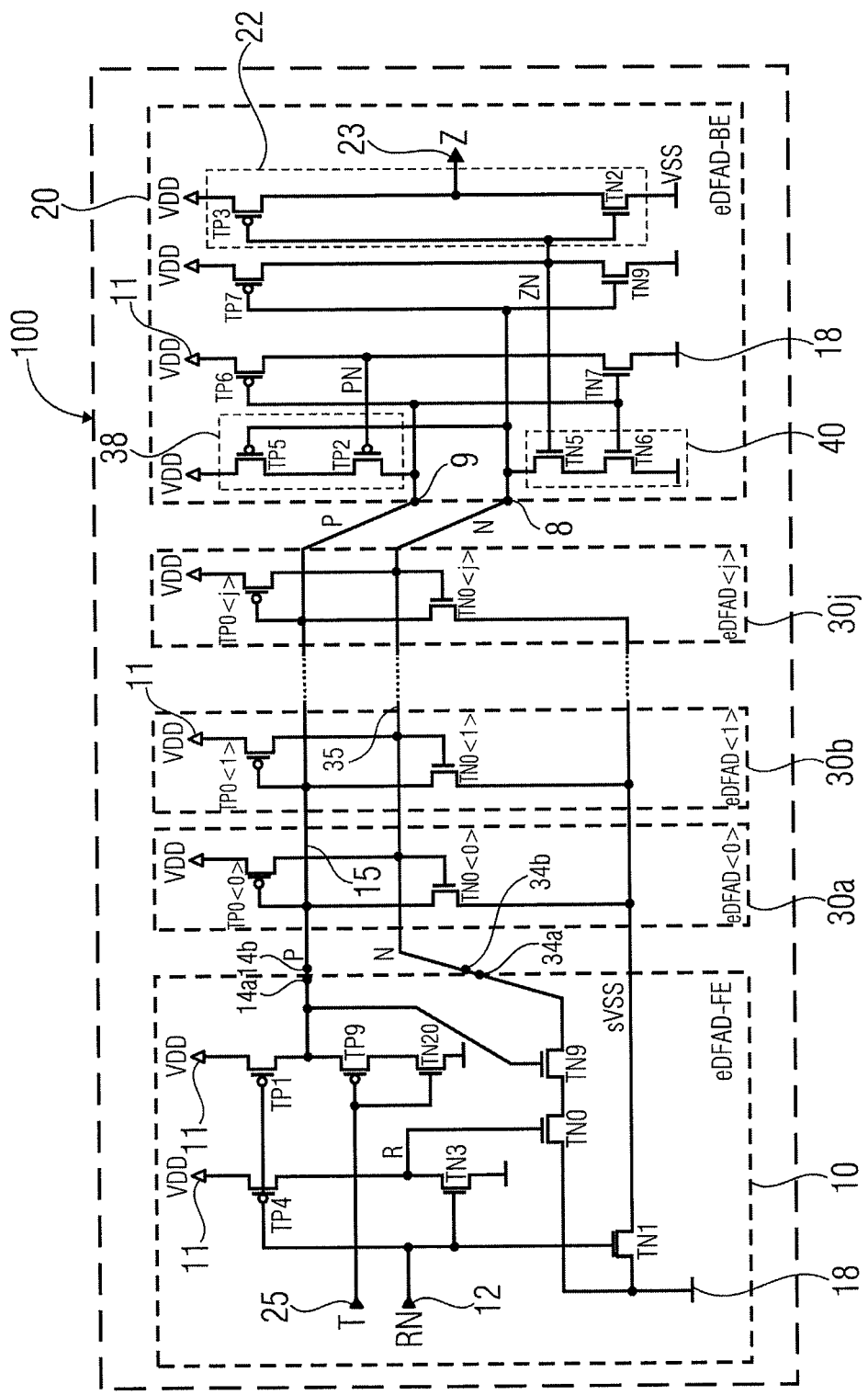
FIG. 6 shows a schematic of a digital fault detection circuit with a different keeper circuit according to another embodiment.

FIG. 6 shows another schematic of a digital fault detection circuit 100, which differs from the embodiment depicted in FIG. 5 with respect to the keeper circuit 20. Compared to the embodiment described in FIG. 5, the keeper circuit 20 in the embodiment in FIG. 6 comprises a reduced number of transistors. The keeper circuit 20 may comprise again an inverter 22 with a p-channel transistor TP3 and a n-channel transistor TN2, whose controllable conductive paths are coupled between the second supply potential VDD and the first supply potential VSS. The keeper circuit comprises again a first pair 38 of p-channel transistors and a second pair 40 of n-channel transistors. The control input of the p-channel transistor TP5 of the first pair 38 is connected to the further signal line 35 and, hence, is turned on, if the second signal line is at the second predetermined signal state. The second transistor TP2 of the first pair 38 of transistors is coupled via the n-channel transistor TN7 to the first supply potential VSS. The control input (gate) of the n-channel transistor TN7 is coupled to the signal line 15. If the signal line 15 is at its predetermined signal state 1, the transistor TN7 is turned on and, hence, the p-channel transistor TP2 is also in a conductive state, since the gate of the transistor TP2 is then coupled via the conductive transistor TN7 to the first supply potential VSS. Consequence of which is that the predetermined signal state at the signal line is kept at 1, since both transistors TP5 and TP6 are in a conductive state so that the signal line 15 is coupled to the second supply potential VDD. On the other hand, the keeper circuit switch TN5 of the second pair 40 of transistors is also turned on if the further signal line 35 is at its second predetermined signal state 0, so that the p-channel transistor TP7 is turned on and, hence, the n-channel transistor TN5 is turned on as well. The transistor TN6 of the second pair 40 of transistors is controlled by the signal state P at the signal line 15. If the signal state P at the signal line 15 is 1, the transistor TN5 is in a conductive state. Accordingly the further signal line 35 is kept at the second predetermined signal state, since the further signal line 35 is via the two conductive transistors TN6 and TN5 coupled to the first supply potential VSS.

The control input or control terminal of the transistor TP5 may be coupled to the further signal line 35 and the control input of the second transistor TP2 of the first pair of transistors is coupled to the controllable conductive path of the transistor TN7, which is controllable by the signal state P at the signal line 15. The control input of the transistor TN6 of the second pair 40 of transistors may be coupled to the signal line 15 and the control input of the transistor TN5 of the second pair of transistors may be coupled to the controllable conductive paths of the transistors TN9 and TP7, which are controllable by the signal state N at the further signal line 35.

If the predetermined signal state is changed from 1 to 0 the transistor TN7 in the keeper circuit is turned off and the p-channel transistor TP6 is turned on, so that the p-channel transistor TP2 and the n-channel transistor TN6 are turned off. Therewith, the predetermined signal states at the signal line and the further signal line are not kept anymore by the keeper circuit 20. The same is true if the second predetermined signal state changes from 0 to 1, so that the p-channel transistor TP5 is turned off and the n-channel transistor TN5 via the conductive transistor TN9 as well. The control terminals of the transistors TP3 and TN2 of the inverter 22 are connected to the node ZN and, hence, the output signal Z is 1 if the second predetermined signal state is changed from 0 to 1.

The fault detection circuit 100 in FIG. 6 may comprise a different fault sensitivity compared to other embodiments, but the operation and the retaining function for the signal states P at the signal line 15 and for the signal state N at the further signal line 35 may be same as in other embodiments herein.

Figure 7:
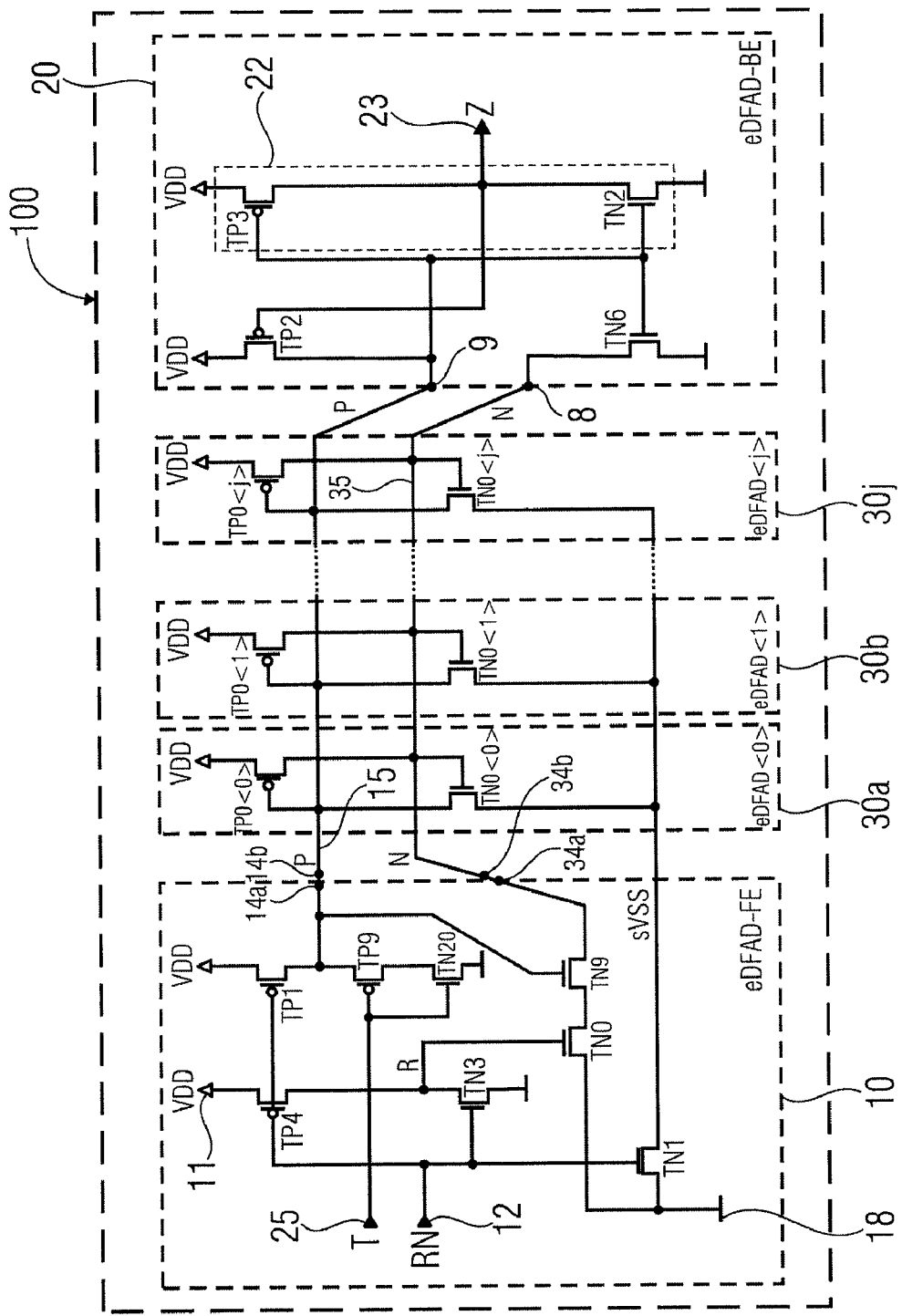
FIG. 7 shows a schematic of a digital fault detection circuit according to another embodiment.

In the embodiment depicted in FIG. 7, the keeper circuit 20 is coupled to the signal line 15 which is at the signal state P and to the further signal line 35 which is at the signal state N. The keeper circuit 20 may be configured to keep the signal line and the further signal line at the respective predetermined signal states—in this embodiment (P,N)=(1,0). The retaining function of the keeper circuit may be active when the second signal state at the input 12 of the input circuit 10 leaves the output 14a and the further output 34a floating and if a test mode signal T=0 is applied to the test mode input 25. The keeper circuit 20 comprises an inverter 22, wherein the control terminals of the two transistors TP3, TN2 are coupled to the signal line 15 at the signal state P. If the signal state P=1 at the signal line, which is the predetermined signal state, the alarm signal Z=0 at the output 23. If P=1 the keeper circuit switch—the transistor TN6—is turned on and, hence, the further signal line 35 is coupled to the first supply potential VSS and therewith kept at the second predetermined signal state. The control terminal of the holding switch TP2 is, in this embodiment, coupled to the output 23 and, hence, if the signal state P at the signal line 15 is 1, TP2 is turned on and the signal line 15 is coupled to the second supply potential VDD. Therefore, the signal line 15 is kept at the predetermined signal state 1 or VDD. If the predetermined signal state at the signal line or the second predetermined signal state at the further signal line 35 is changed by one of the fault detector cells 30a to 30j, because of a fault, the transistors TP2 and TN6 are turned off.

Some embodiments of the digital fault detection circuit show fault detector cells, which comprise first detector cell switches. A first detector cell switch, for example TN0<0>, can be coupled between the signal line 15 and the switchable first supply potential sVSS, and a second detector cell switch of a fault detector cell, for example TP0<0>, can be coupled between the further signal line 35 and the second supply potential. First detector cell switches of the fault detector cells may be configured to separate the switchable first supply potential sVSS from the signal line 15 in the absence of a fault and to connect the switchable first supply potential to the signal line 15 in response to a fault. Second detector cell switches of the fault detector cells may be configured to separate the second supply potential from the further signal line 35 in the absence of a fault and to connect the second supply potential to the further signal line 35 in response to a fault.

In another embodiment the digital fault detection circuit may comprise a keeper circuit with at least one keeper circuit switch, for example, TP2 coupled between the signal line output 9 and the second supply potential and at least one keeper circuit switch, for example TN6 coupled between the further signal line 35 output and the first supply potential. The keeper circuit switches may be controlled dependent on the signal states at the signal line 15 and the further signal line 35 to connect the signal line output 9 to the second supply potential and the further signal line output 8 to the first supply potential in the absence of a fault, and to separate the signal line output from the second supply potential and the further signal line output from the first supply potential in response to a fault.

In another embodiment of a digital fault detection circuit a current conducting strength of the detector cell switches may be larger than a current conducting strength of the keeper circuit switches.

A digital fault detection circuit may comprise an input circuit with a first switch TP1, which connects the signal line input 14b to the second supply potential if the first signal state is applied to the input 12 of the input circuit and which separates the signal line input 14b from the second supply potential if the second signal state at the input 12 of the input circuit is applied. According to other embodiments a connection and a disconnection of the signal line input 14b to the second supply potential may still depend on a test mode signal T applied to a test mode input. A second switch TN0 connects the further signal line input 34b to the first supply potential if the first signal state is applied to the input 12 of the input circuit and separates the further signal line input from the first supply potential if the second signal state is applied to the input 12 of the input circuit. A third switch TN1 separates all detector cell switches TN0<0>, . . . TN0<j> from the switchable first supply potential sVSS if the first signal state is applied to the input 12 of the input circuit and connects all detector cell switches to the switchable first supply potential sVSS if the second signal state is applied to the input 12 of the input circuit.

In embodiments a digital fault detection circuit 100 may comprise a fault detector cell, wherein a control terminal of a first detector cell switch, for example TN0<0>, is connected to the further signal line 35 and wherein a control terminal of the second detector cell switch, for example TP0<0> is connected to the signal line 15.

A digital fault detection circuit 100 may further comprise a keeper circuit, wherein the keeper circuit comprises an output. A signal state at the output of the keeper circuit may then indicate whether a fault of the digital fault detection circuit 100 has taken place.

Figure 8:
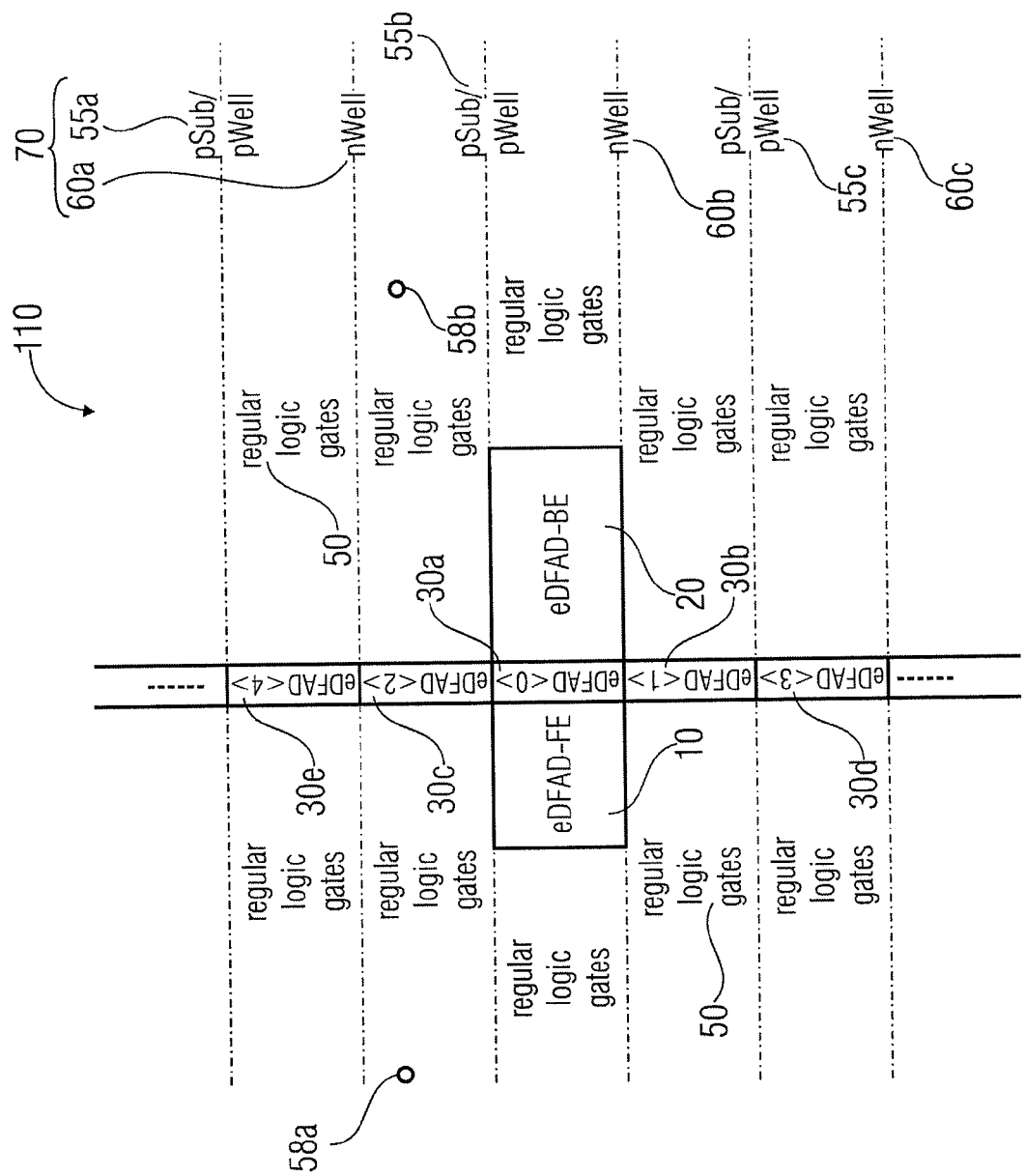
FIG. 8 shows a schematic layout of an integrated circuit with a digital fault detection circuit according to an embodiment.

According to another embodiment, in FIG. 8, a schematic top view of a layout of an integrated circuit 110 is depicted. In this embodiment, an integrated circuit 110 may comprise a semiconductor substrate 70, wherein the semiconductor substrate 70 comprises a plurality of alternating slices of p-type doped regions 55a,b,c . . . and a plurality of n-type doped regions 60a,b,c . . . . The dashed lines may show the center lines of the respective n- or p-type doped regions. The p-type doped regions may be so-called p-sub/or p-wells in which n-channel transistors for the integrated circuit 110 are formed. In the n-type doped regions, p-channel transistors of the integrated circuit may be formed. The p-channel and the n-channel transistors are not shown in FIG. 8.

The integrated circuit 110 may comprise regular logic gates 50 of an operational circuit to be protected and which are formed by the above mentioned p- and n-channel transistors and which are arranged across the semiconductor substrate 70. The regular logic gates may be a possible target of an attack. A regular logic gate can be an operational circuit unit. Such an operational circuit unit may be, for example, a memory cell, wherein in some embodiments the memory cells may be arranged physically adjacent to the fault detector cells in the semiconductor substrate.

The functionality of the logic gates may be defined, for example, by the logic linking and the combination of the n- and p-channel transistors arranged in the respective n-type doped regions 60a,b,c . . . and p-type doped regions 55a,b, c . . . . The integrated circuit may furthermore comprise a digital fault detection circuit 100. The digital fault detection circuit may be formed as described in embodiments herein. Among other elements, the digital fault detection circuit may comprise an input circuit 10, a keeper circuit 20, a signal line 15, a further signal line 35 and a plurality of fault detector cells 30a to 30e. The plurality of fault detector cells are coupled to the signal line 15 and the further signal line 35. Moreover the fault detector cells are configured, as described above, to change the state at the signal line and the state at the further signal line, which is kept by the keeper circuit, in response to a fault, for example, upon an attack or manipulation of the regular logic gates 50 of the integrated circuit 110. If a transistor of a regular logic gate 50 of the integrated circuit is attacked, for example by ionizing radiation or fluctuation of the supply potentials VDD-VSS, this may provoke at least one of the plurality of fault detector cells to change the predetermined signal state at the signal line or the second predetermined signal state at the further signal line and, hence, an alarm may be output. The plurality of logic gates 50 of an operational circuit to be protected, can be arranged in the p-type doped regions and the n-type doped regions. The input circuit and the keeper circuit may be arranged in a first slice of a p-type doped region and/or a first slice of a n-type doped region, and wherein the plurality of fault detector cells are distributed across a plurality of slices of n-type doped regions and/or p-type doped regions.

In the embodiment in FIG. 8, the input circuit 10, the keeper circuit 20 and one of the fault detector cells 30a can be arranged, for example, side-by-side—in one "slice"—, in a p-type doped region 55b and/or in the n-well 60b. Each of the remaining fault detector cells 30b to 30e may be arranged in the semiconductor substrate in p-type doped regions and/or n-type doped regions in the semiconductor substrate plane laterally above and/or below the input circuit 10, the keeper circuit 20 and the fault detector cells 30a. Then, a fault or an attack on a regular logic gate 50 may result in an alarm signal output by the digital fault detection circuit.

In FIG. 8, a physical arrangement or layout of a digital fault detection circuit in a semiconductor substrate for an integrated circuit 110 is schematically depicted. In this embodiment, it is assumed that the semiconductor substrate comprises a linear alternating sequence of p-substrate or p-well regions 55a,b,c, . . . in which n-channel transistors are arranged and n-well-regions 60a,b,c, . . . in which p-channel transistors are arranged. This may be true, for example, for Semi-Custom CMOS implementations, i.e. standard cells, and mostly also for CMOS Full-Custom circuits, since such an arrangement or layout is a natural or an inherent consequence of a regular arrangement or an arrangement in rows of the gates or cells.

As it is shown in FIG. 8, the input circuit 10, the keeper circuit 20 and one of the fault detector cells 30a can be arranged side-by-side in one slice in a p-well region 55b and/or a n-well region 60b. In other embodiments the input circuit 10 and the keeper circuit 20 may be randomly distributed on the semiconductor substrate.

The input circuit 19, the keeper circuit 20 and a plurality of fault detector cells can be distributed across a plurality of slices of n-type doped regions and/or p-type doped regions.

The remaining fault detector cells 30b to 30e may be arranged laterally shifted above and/or below in the semiconductor substrate plane. If the fault detection cells are arranged centrically between relatively wide spaced well- or substrate-contacts 58a and 58b, one of the fault detection cells, which may comprise only two transistors, as described above, may be sufficient to detect an attack on a plurality of regular logic gates 50 in the respective n- or p-type doped region. In other words, if a digital fault detection circuit is arranged in an integrated circuit in the above described way, it may be possible to monitor or detect an attack on a large number of regular logic gates 50. Therefore it may be possible to detect a fault or an attack in a large area of the integrated circuit with a low number of fault detection cells. In FIG. 8, for example, two substrate- or well-contacts 58a and 58b are schematically depicted, wherein the associated fault detection cell 30c is arranged centrically to the relatively wide spaced substrate- or well-contacts 58a and 58b.

Figure 9:
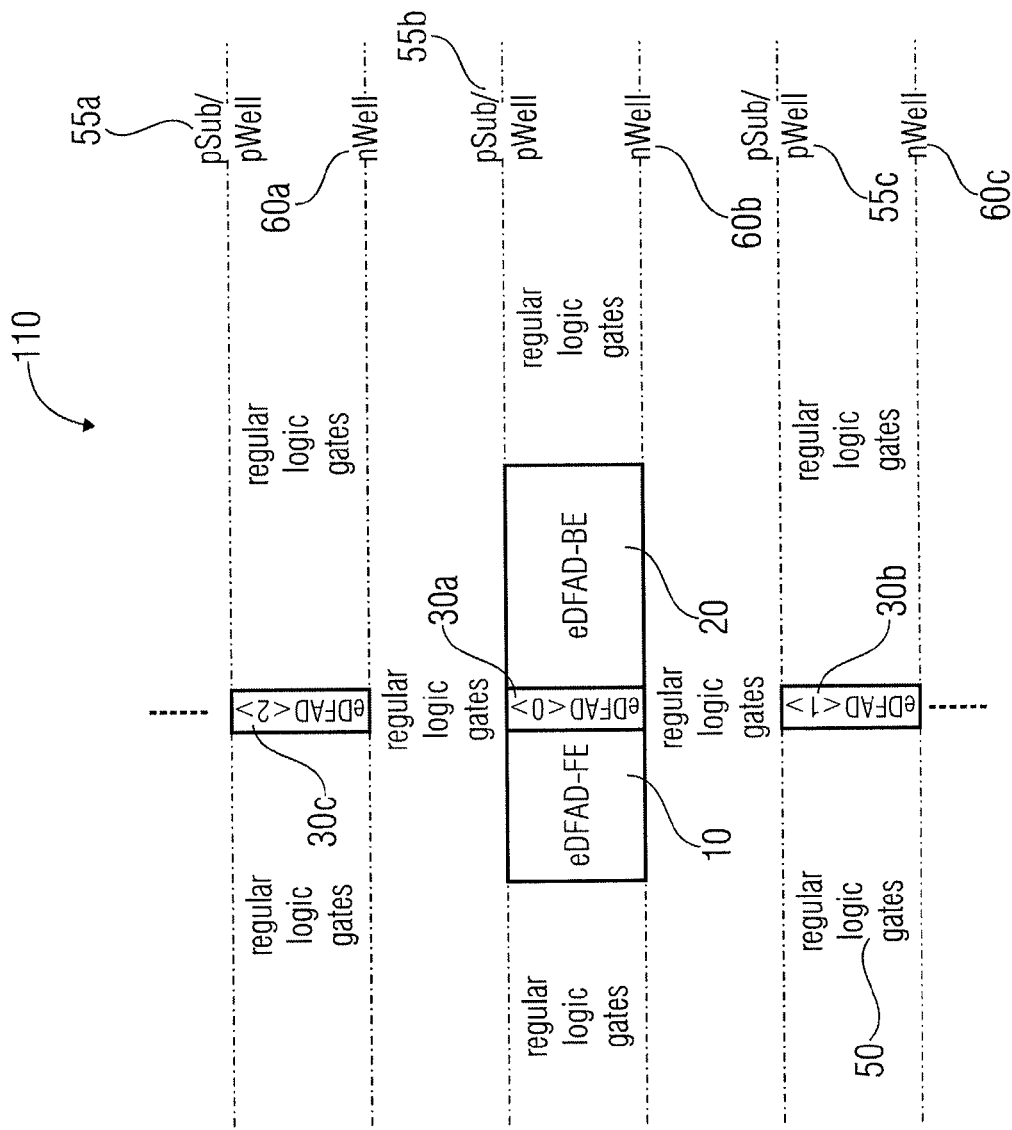
FIG. 9 shows a further schematic layout of an integrated circuit with a digital fault detection circuit according to another embodiment.

In FIG. 9, in a further embodiment another integrated circuit 110 is schematically depicted. According to this embodiment, the integrated circuit 110 may comprise in each second "row of gates" a fault detection cell. Compared to other layouts, this layout of an integrated circuit with fault detection circuit may need less chip area. In this embodiment, one p-channel transistor of a fault detection cell per n-well slice and one n-channel transistor per p-substrate or p-well slice may be sufficient to detect with a sufficient high certainty a fault, an error attack or a manipulation. One n-channel transistor and one p-channel transistor may form the fault detector cell as described herein and the use of a single n-channel and p-channel transistor per p-substrate well or n-well may be sufficient to detect a fault or an attack. The probability to detect a fault may depend among others on the process technology for fabricating the integrated circuit that means, for example, it may depend on the technology generation and whether the integrated circuit is fabricated in a dual-well or in a triple well process.

Figure 10:
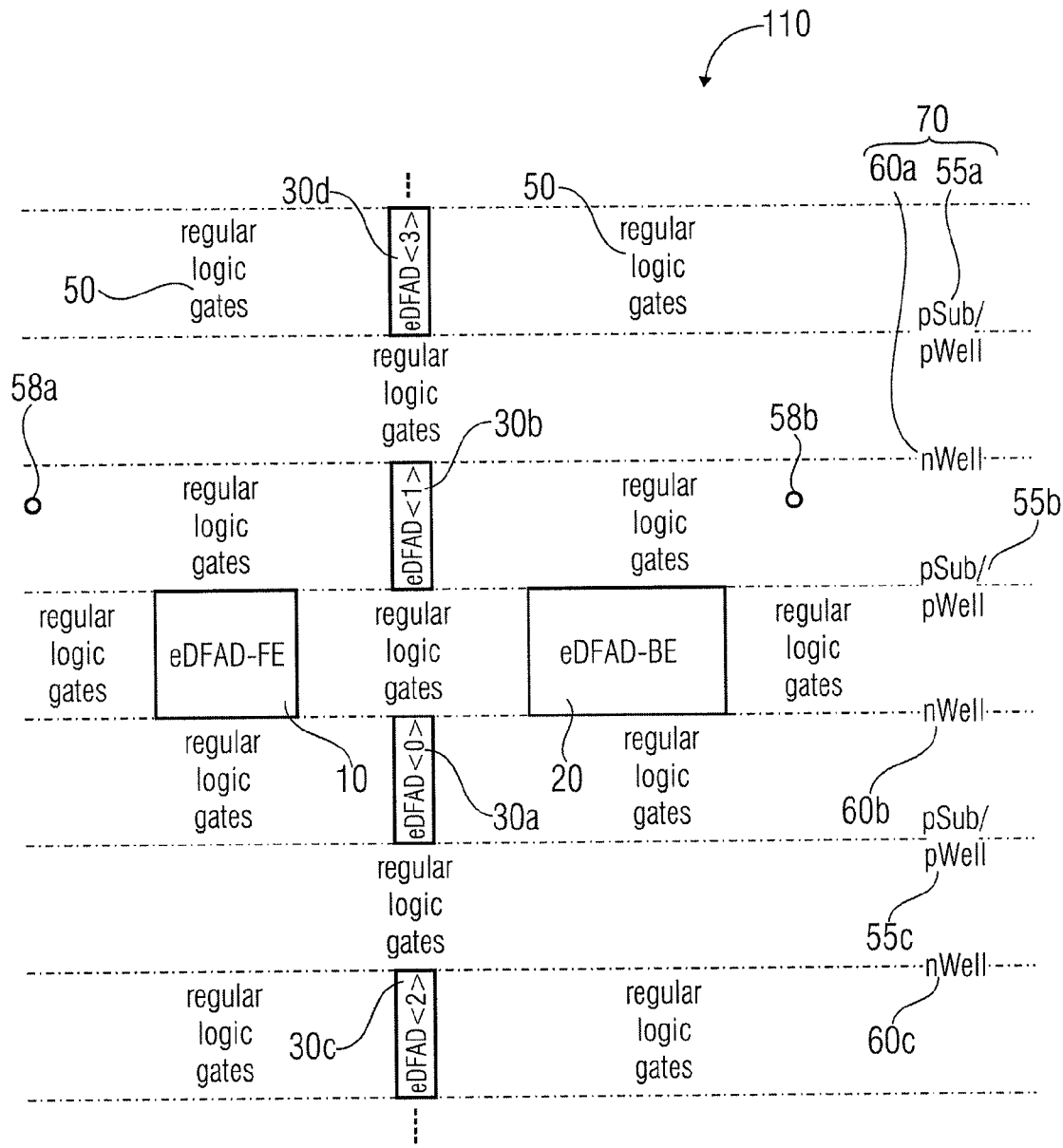
FIG. 10 shows a further schematic layout of an integrated circuit with a digital fault detection circuit according to an embodiment.

In FIG. 10, a further embodiment of an integrated circuit 110 with digital fault detection circuit is shown. In this embodiment, the slice in which the input circuit 10 and the keeper circuit 20 are arranged comprises no fault detection cell. Furthermore, the input circuit 10 and the keeper circuit 20 may be arranged apart from each other. The attack detection cells are again arranged in every second alternating "row of gates" or slices of p-type and n-type doped regions above and/or below the input circuit 10 and the keeper circuit 20. The fault detection cells 30a to 30d may be arranged centrically located between well-contacts or substrate-contacts 58a and 58b. It should be noted that, of course, every n-well or p-well slice may comprise a respective well- or substrate-contact.

In an embodiment a fault detector cell can comprise a p-channel fault detector transistor and a n-channel fault detector transistor and wherein the plurality of fault detector cells are arranged such that at least one p-channel fault detector cell transistor is arranged in each slice of an n-type doped region and at least one n-channel fault detector transistor is arranged in each slice of a p-type doped region. In a further embodiment the plurality of fault detector cells can be arranged such that fault detector transistors of adjacent fault detector cells are arranged in the same slice (see FIG. 8). That means there could be two fault detector transistors arranged in a slice, one being part of a first fault detector cell and the second being part of a second fault detector cell.

It is possible that the above-described embodiments of a digital fault detection circuit can be implemented in an inverse way, if the respective n- and p-channel transistors which are forming the circuit and the supply potentials are exchanged. These embodiments are herewith included. It may be also possible to realize a digital fault detection circuit with bipolar transistors. In this case, the control terminal may be named base and the controllable conductive path of the transistor may be arranged between the emitter and the collector terminal of the bipolar transistor. The bipolar transistor may be an npn-bipolar transistor or a pnp-bipolar transistor. In the case of CMOS-field effect transistors (CMOS-FET), the control terminal may be the gate terminal and the controllable conductive path or the channel of the field effect transistor may be arranged between the source and the drain terminals or contacts of such a field effect transistor. The transistors may be switches, which can be turned on and off. According to embodiments, a digital recognition of an error attack is realized, wherein an efficient and scalable arrangement of switching elements, for example, transistors for the detection or recognition of error attacks on regions or areas on a chip with a selectable size or expansion, as well as for an output of an alarm signal in case of a recognized error attack is disclosed.

According to some embodiments, a digital fault detection circuit may be used for the efficient recognition of a fault, for example, upon an attack on digital circuits in an integrated circuit. Such an integrated circuit may, for example, be used for security applications, such as smart cards etc. A fault attack or an attack may be performed by means of ionizing radiation or among others, calculated fluctuation of the supply voltage (VDD-VSS) of the integrated circuit. According to other embodiments an integrated circuit may include a digital fault detection circuit as described herein and may additionally comprise other attack detection means. For example, on an integrated circuit which may be used in security relevant applications, additional light- and/or (voltage-) spike sensors may be integrated. Such light and spike sensors may be formed as analog circuits which are designed to protect the whole integrated circuit or at least a large area or region of the integrated circuit against an attack by means of, for example, ionizing radiation or deliberate fluctuations of the supply voltage. According to embodiments, the digital fault detection circuit can also be employed to protect single smaller sub-circuits or groups of circuits against a local attack. The functional principles of analog circuits for protecting an integrated circuit may make use of different physical effects than are exploited for fault attacks on digital circuits, e.g. CMOS gates in order to achieve the desired malfunction of the digital circuit. Therefore, it can be difficult to detect a local attack on a single small sub-circuit by means of such analog circuits.

Figure 11:
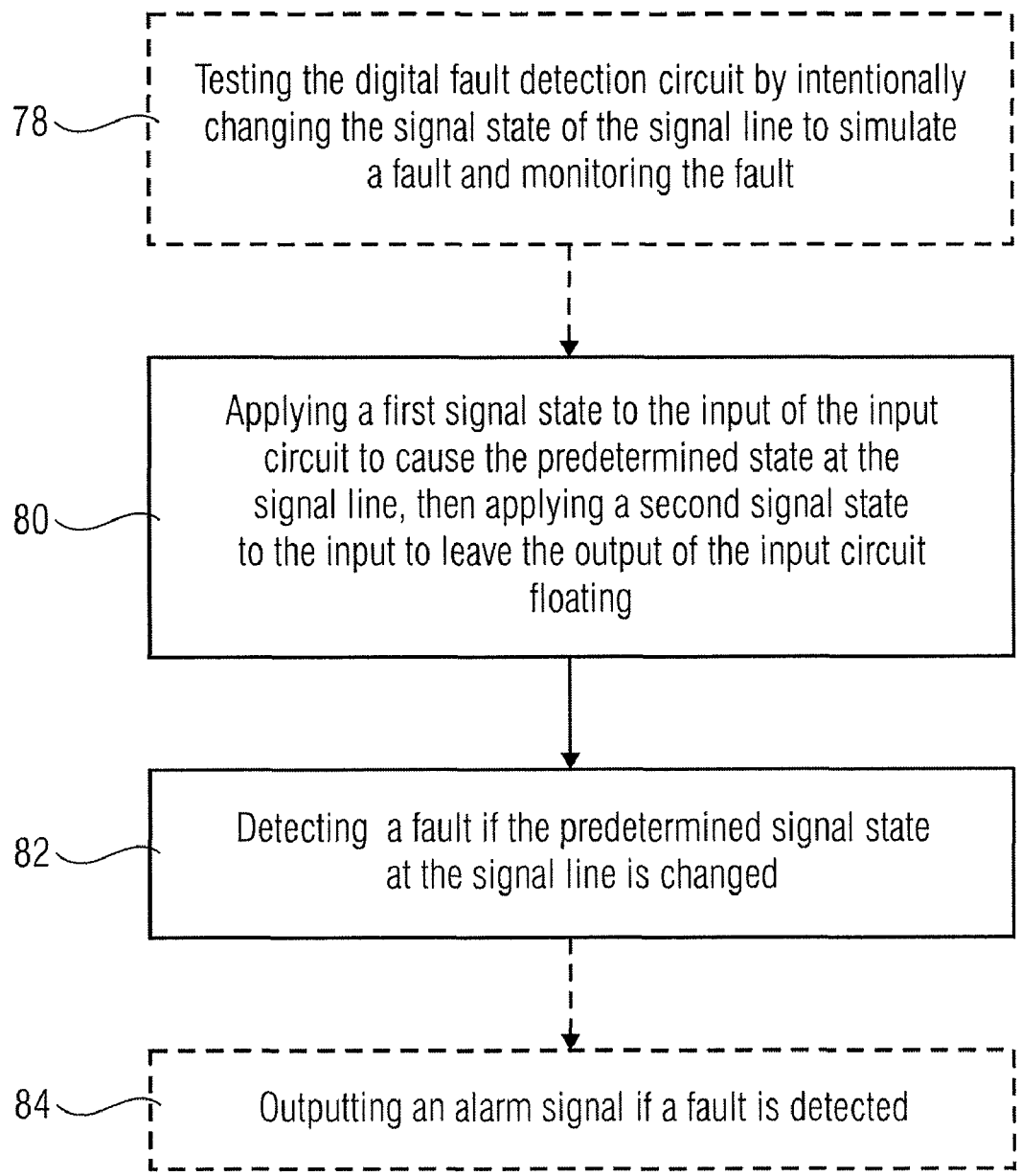
FIG. 11 shows a flow chart for a method for detecting a fault with a digital fault detection circuit according to an embodiment.

In FIG. 11, according to an embodiment the flow chart of the method for detecting a fault on an integrated circuit using a digital fault detection circuit is shown. The digital fault detection circuit which is used for this method may be formed as described in embodiments herein. The digital fault detection circuit may, for example, comprise an input circuit with an input and at least one output, wherein a first signal state at the input causes a predetermined signal state at the output and a second signal state at the input leaves the output floating. Moreover the digital fault detection circuit may comprise a signal line comprising a signal line input and a signal line output, wherein the signal line input is coupled to the output of the input circuit. The keeper circuit may be coupled to the signal line output and configured to keep the signal line at the predetermined signal state, after the signal state at the input has changed from the first signal state to the second signal state. Furthermore the digital fault detection circuit may comprise at least one fault detector cell, which is coupled to the signal line between the signal line input and the signal line output and which is configured to change the state of the signal line which is kept by the keeper circuit, in response to a fault.

The method for detecting a fault with the digital fault detection circuit may comprise applying 80 the first signal state to the input to cause the predetermined signal state at the signal line, then applying a second signal state at the input of the input circuit to leave the output of the input circuit floating. The predetermined signal state at the signal line is kept by the keeper circuit. The method further comprises detecting 82 a fault, if the predetermined signal state at the signal line is changed.

According to another embodiment, the method for detecting a fault on an integrated circuit may comprise testing 78 optionally the digital fault detection circuit. This may be performed by setting the signal line of the digital fault detection circuit at a signal state indicative of a fault. Testing may be performed by changing the predetermined signal state at the signal line. For example, a test mode signal can be applied to a test mode input of the digital fault detection circuit and wherein upon the test mode signal the predetermined signal state is changed. The test mode signal may be configured to cause an opposite signal state to the predetermined signal state at the signal line. Testing 78 may be performed as a so-called "life test" in order to check or evaluate the correct functionality of the digital attack detection circuit and to verify whether the connections and wires between the elements are intact and work correctly. This means testing may be performed in order to verify the correct functionality of the implemented eDFAD. This verification can be performed before the "regular switching on" of the integrated circuit in order to ensure that no manipulation has taken place which could affect the correct function of the eDFAD. According to some embodiments the method comprises testing 78 of the digital attack detection circuit by setting a signal line of the digital attack detection circuit on a signal state indicative for an attack, before applying 80 the first signal state to the input.

In embodiments the method may comprise testing the digital fault detection circuit by intentionally changing the signal state of the signal line to simulate a fault; and monitoring whether the fault is detected. This can be, for example, performed by applying a test mode signal to a respective test mode input of the digital fault detection circuit.

The method may further comprise outputting 84 an alarm signal if a fault is detected.

While this invention has been described in terms of several embodiments, there are alterations, permutations and equivalents which fall within the scope of this invention. It should also be noted that there are many alternative ways of implementing the digital fault detection circuit, performing the methods for detecting a fault on an integrated circuit with a digital fault detection circuit and compositions of the present invention. It is therefore intended that the following appended claims be interpreted as including all such alternations, permutations and equivalents as falling within the true spirit in the scope of the present invention.

The invention claimed is:

1. A digital fault detection circuit, comprising:
   an input circuit comprising an input and at least one output, wherein a first signal state at the input causes a predetermined signal state at the output and a second signal state at the input leaves the output floating;
   a signal line comprising a signal line input and a signal line output, wherein the signal line input is coupled to the output of the input circuit;
   a keeper circuit coupled to the signal line output and configured to keep the signal line at the predetermined signal state, after the signal state at the input has changed from the first signal state to the second signal state; and
   at least one fault detector cell coupled to the signal line between the signal line input and the signal line output, and configured to change the state of the signal line which is otherwise kept by the keeper circuit, in response to a fault,
   wherein the fault detector cell comprises a detector cell switch coupled between the signal line and a switchable first supply potential, wherein the detector cell switch is configured to separate the switchable first supply potential from the signal line in the absence of a fault and to connect the switchable first supply potential to the signal line in response to a fault.

2. The digital fault detection circuit according to claim 1, comprising a plurality of fault detector cells coupled to the signal line between the signal line input and the signal line output.

3. The digital fault detection circuit according to claim 1, wherein the keeper circuit comprises a keeper circuit switch coupled between the signal line output and a second supply potential, wherein the keeper circuit switch is configured to connect the signal line output to the second supply potential to keep the signal line at the predetermined signal state in the absence of a fault, and to separate the signal line from the second supply potential in response to a fault.

4. The digital fault detection circuit according to claim 3, wherein a current conducting capacity of the detector cell switch is larger than a current conducting switch of the keeper circuit switch.

5. The digital fault detection circuit according to claim 3, wherein the keeper circuit switch and/or the detector cell switch comprises a control input receiving a control signal depending on the signal state at the signal line.

6. The digital fault detection circuit according to claim 5, wherein the control input of the keeper circuit switch and/or the detector cell switch is coupled to the signal line output by an inverter.

7. The digital fault detection circuit according to claim 1, wherein the input circuit comprises:
   a first switch connecting the signal line input to a second supply potential in case of the first signal state at the input of the input circuit, and separating the signal line input from the signal line input in case of the second signal state at the input; and
   a second switch separating the detector cell switch from the first supply potential in case of the first signal state at the input of the input circuit, and connecting the detector cell switch to the first supply potential in case of the second signal state at the input of the input circuit.

8. The digital fault detection circuit according to claim 1, wherein the input circuit comprises:
   a further output, wherein the first signal state at the input causes a second predetermined signal state at the further output and wherein the second signal state at the input leaves the further output floating; and
   a further signal line comprising a further signal line input and a further signal line output, wherein the further signal line input is coupled to the further output of the input circuit;
   wherein the keeper circuit is coupled to the further signal line output and configured to keep the further signal line at the second predetermined signal state, after the signal state at the input of the input circuit has changed from the first signal state to the second signal state, and
   wherein the at least one fault detector cell is coupled to the further signal line between the further signal line input and the further signal line output and changes the signal line state at the further signal line, which is otherwise kept by the keeper circuit, in response to a fault.

9. The digital fault detection circuit according to claim 8, wherein the fault detector cell comprises a first detector cell switch coupled between the signal line and a first supply potential and a second detector cell switch coupled between the further signal line and a second supply potential,
   wherein the first detector cell switch is configured to separate the first supply potential from the signal line in the absence of a fault and to connect the first supply potential to the signal line in response to a fault, and
   wherein the second detector cell switch is configured to separate the second supply potential from the further signal line in the absence of a fault and to connect the second supply potential to the further signal line in response to a fault.

10. The digital fault detection circuit according to claim 9, wherein the keeper circuit comprises at least one keeper circuit switch coupled between the signal line output and the second supply potential and at least one keeper circuit switch coupled between the further signal line output and the first supply potential,
   wherein the keeper circuit switches are controlled dependent on the signal states at the signal line and the further signal line to connect the signal line output to the second supply potential and the further signal line output to the first supply potential in the absence of a fault, and to separate the signal line output from the second supply potential and the further signal line output from the first supply potential in response to a fault.

11. The digital fault detection circuit according to claim 10, comprising a series connection of two keeper circuit switches coupled between the signal line output and the second supply potential, a first one controlled by the signal state at the further signal line and a second one controlled by an inverted version of the signal state at the signal line.

12. The digital fault detection circuit according to claim 10, wherein a current conducting capacity of the detector cell switches is larger than a current conducting capacity of the keeper circuit switches.

13. The digital fault detection circuit according to claim 9, wherein the input circuit comprises:
a first switch connecting the signal line input to the second supply potential in case of the first signal state at the input of the input circuit and separating the signal line input from the second supply potential in case of the second signal state at the input of the input circuit;
a second switch connecting a further signal line input to the first supply potential in case of the first signal state at the input of the input circuit and separating the further signal line input from the first supply potential in case of the second signal state at the input of the input circuit; and
a third switch separating the first detector cell switch from the first supply potential in case of the first signal state at the input of the input circuit and connecting the first detector cell switch to the first supply potential in case of the second signal state at the input of the input circuit.

14. The digital fault detection circuit according to claim 9, wherein a control terminal of the first detector cell switch is connected to the further signal line and wherein a control terminal of the second detector cell switch is connected to the signal line.

15. The digital fault detection circuit according to claim 1, wherein the keeper circuit comprises an output, wherein a signal state at the output of the keeper circuit indicates whether a fault has taken place.

16. The digital fault detection circuit according to claim 1, further comprising:
a test mode switch coupled to a test mode input and configured to change the state of the signal line upon receipt of a test mode signal at the test mode input to simulate a fault.

17. A digital fault detection circuit, comprising:
an input circuit comprising an input, a first output and a second output, wherein a first signal state at the input causes a predetermined signal state at the first output and a second predetermined signal state at the second output, wherein a second signal state at the input leaves the first output and the second output floating;
a signal line comprising a signal line input and a signal line output and a further signal line comprising a further signal line input and a further signal line output, wherein the signal input is coupled to the output of the input circuit and wherein the further signal line input is coupled to the further output of the input circuit;
a keeper circuit coupled to the signal line output and to the further signal line output and configured to keep the signal line at the predetermined state and the further signal line at the second predetermined signal state, after the signal state at the input of the input circuit has changed from the first signal state to the second signal state; and
at least one fault detector cell coupled to the signal line between the signal line input and the signal line output and coupled to the further signal line between the further signal line input and the further signal line output and configured to change the signal state at the signal line and at the further signal line, which are otherwise kept by the keeper circuit, in response to a fault.

18. An integrated circuit comprising:
a semiconductor substrate, wherein the semiconductor substrate comprises a plurality of alternating slices of p-type doped regions comprising n-channel transistors and n-type doped regions comprising p-channel transistors;
a digital fault detection circuit comprising:
an input circuit comprising an input, a first output and a second output, wherein a first signal state at the input causes a first predetermined signal state at the first output and a second predetermined signal state at the second output, wherein a second signal state at the input leaves the first output and the second output floating;
a signal line comprising a signal line input and a signal line output and a further signal line comprising a further signal line input and a further signal line output, wherein the signal input is coupled to the output of the input circuit and wherein the further signal line input is coupled to the further output of the input circuit;
a keeper circuit coupled to the signal line output and to the further signal line output and configured to keep the signal line at the first predetermined state and the further signal line at the second predetermined signal state, after the signal state at the input of the input circuit has changed from the first signal state to the second signal state; and
a plurality of fault detector cells coupled to the signal line between the signal line input and the signal line output and coupled to the further signal line between the further signal line input and the further signal line output, wherein each of the fault detector cells is configured to change the signal state at the signal line and at the further signal line, which are otherwise kept by the keeper circuit, in response to a fault; and
a plurality of operational circuit units to be protected, arranged in the p-type doped regions and the n-type doped regions,
wherein the input circuit, the keeper circuit and the plurality of fault detector cells are distributed across a plurality of slices of n-type doped regions and/or p-type doped regions.

19. The integrated circuit according to claim 18, wherein the p-type doped regions and the n-type doped regions comprise substrate contact terminals spaced apart from each other, and wherein the fault detector cells comprise a p-channel fault detector cell transistor and a n-channel fault detector cell transistor, one being coupled to the signal line and the other being coupled to the further signal line, and wherein the p-channel fault detector cell transistor and the n-channel fault detector cell transistor are configured to change the state at the signal line and at the further signal line, which are otherwise kept by the keeper circuit, in response to a fault of a logic gate, and wherein the fault detector cell is arranged centrically between the spaced substrate contact terminals.

20. The integrated circuit according to claim 18, wherein the fault detector cells comprise a p-channel fault detector transistor and a n-channel fault detector transistor, and wherein the plurality of fault detector cells are arranged such that at least one p-channel fault detector cell transistor is arranged in each slice of an n-type doped region and at least one n-channel fault detector transistor is arranged in each slice of a p-type doped region.

21. The integrated circuit according to claim 20, wherein the plurality of fault detector cells are arranged such that fault detector transistors of adjacent fault detector cells are arranged in the same slice.

22. A method for detecting a fault using a digital fault detection circuit,
wherein the digital fault detection circuit comprises:
an input circuit comprising an input and at least one output, wherein a first signal state at the input causes a predetermined signal state at the output and a second signal state at the input leaves the output floating,
a signal line comprising a signal line input and a signal line output, wherein the signal line input is coupled to the output of the input circuit,
a keeper circuit coupled to the signal line output and configured to keep the signal line at the predetermined signal state, after the signal state at the input has changed from the first signal state to the second signal state, and
at least one fault detector cell coupled to the signal line between the signal line input and the signal line output and configured to change the state of the signal line which is otherwise kept by the keeper circuit, in response to a fault,
wherein the fault detector cell comprises a detector cell switch coupled between the signal line and a switchable first supply potential, wherein the detector cell switch is configured to separate the switchable first supply potential from the signal line in the absence of a fault and to connect the switchable first supply potential to the signal line in response to a fault,
wherein the method comprises:
applying the first signal state to the input to cause the predetermined state at the signal line, then applying a second signal state to the input to leave the output floating, while the predetermined signal state at the signal line is kept by the keeper circuit; and
detecting a fault if the predetermined signal state at the signal line is changed.

23. The method according to claim 22, further comprising:
testing the digital fault detection circuit by intentionally changing the signal state of the signal line to simulate a fault; and
monitoring whether the fault is detected.

24. The method according to claim 22, further comprising: outputting an alarm signal if a fault is detected.

* * * * *